(12) United States Patent
Ikeda

(10) Patent No.: US 11,195,866 B2
(45) Date of Patent: Dec. 7, 2021

(54) IMAGING DEVICE INCLUDING PHOTOELECTIC CONVERSION ELEMENT AND TRANSISTOR

(71) Applicant: SEMICONDUCTOR ENERGY LABORATORY CO., LTD., Atsugi (JP)

(72) Inventor: Takayuki Ikeda, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 16/618,871

(22) PCT Filed: May 29, 2018

(86) PCT No.: PCT/IB2018/053785
§ 371 (c)(1),
(2) Date: Dec. 3, 2019

(87) PCT Pub. No.: WO2018/224910
PCT Pub. Date: Dec. 13, 2018

(65) Prior Publication Data
US 2020/0091214 A1 Mar. 19, 2020

(30) Foreign Application Priority Data
Jun. 8, 2017 (JP) .............................. JP2017-113393

(51) Int. Cl.
*H01L 27/146* (2006.01)
*H01L 29/786* (2006.01)
(Continued)

(52) U.S. Cl.
CPC ......... *H01L 27/14614* (2013.01); *G06N 3/08* (2013.01); *H01L 27/14616* (2013.01); *H01L 27/14636* (2013.01); *H01L 27/14643* (2013.01)

(58) Field of Classification Search
CPC ........ G01S 7/487; G01S 17/08; G01S 7/4863; H04N 5/35572; H04N 5/3745;
(Continued)

(56) References Cited

U.S. PATENT DOCUMENTS 6,043,675 A 3/2000 Miyamoto
6,130,713 A * 10/2000 Merrill .................... G01S 7/487
348/297
(Continued)

FOREIGN PATENT DOCUMENTS

JP 02-242488 A 9/1990
JP 10-276071 A 10/1998
(Continued)

OTHER PUBLICATIONS

International Search Report (Application No. PCT/IB2018/053785) dated Jul. 17, 2018.
(Continued)

*Primary Examiner* — Sonya McCall-Shepard
(74) *Attorney, Agent, or Firm* — Fish & Richardson P.C.

(57) ABSTRACT

An imaging device that generates a pulse signal by utilizing photoelectric conversion operation is provided.
A data potential generated by the photoelectric conversion operation is input to a pulse generation circuit to output a pulse signal having a spike waveform. In addition, a structure in which product-sum operation of pulse signals is performed is provided, and digital data is generated from a new pulse signal. The digital data is taken into a neural network or the like, whereby processing such as image recognition can be performed. Processing up to taking an enormous amount of image data into a neural network or the like can be performed in the imaging device; thus, processing can be efficiently performed.

18 Claims, 19 Drawing Sheets

(51) Int. Cl.
*G06N 3/08* (2006.01)
*G06N 3/04* (2006.01)
*G06N 3/063* (2006.01)
*H04N 5/225* (2006.01)
*H04N 5/3745* (2011.01)

(58) Field of Classification Search
CPC .. H04N 5/3765; H04N 5/3658; H04N 5/3532; H04N 5/225; H01L 27/14614; H01L 27/14616; H01L 27/14636; H01L 27/14643; H01L 27/14689; H01L 29/786; G06N 3/08; G06N 3/0472; G06N 3/0445; G06N 3/0454; G06N 3/0635; G06N 3/088; G06N 3/0481
See application file for complete search history.

(56) References Cited

U.S. PATENT DOCUMENTS

| | | | |
|---|---|---|---|
| 6,208,282 | B1 | 3/2001 | Miyamoto |
| 6,333,709 | B2 | 12/2001 | Miyamoto |
| 8,378,391 | B2 | 2/2013 | Koyama et al. |
| 8,916,869 | B2 | 12/2014 | Koyama et al. |
| 9,331,112 | B2 | 5/2016 | Koyama et al. |
| 9,773,814 | B2 | 9/2017 | Koyama et al. |
| 9,773,832 | B2 | 9/2017 | Kurokawa |
| 10,051,221 | B2 | 8/2018 | Sakakibara |
| 10,074,687 | B2 | 9/2018 | Kurokawa |
| 10,348,995 | B2 | 7/2019 | Harada |
| 2001/0000661 | A1 | 5/2001 | Miyamoto |
| 2009/0009643 | A1* | 1/2009 | Muroshima ......... H04N 5/3532 348/308 |
| 2019/0067360 | A1 | 2/2019 | Kurokawa |

FOREIGN PATENT DOCUMENTS

| | | |
|---|---|---|
| JP | 2011-119711 A | 6/2011 |
| JP | 2015-216592 A | 12/2015 |
| JP | 2016-092470 A | 5/2016 |
| JP | 2016-123087 A | 7/2016 |
| WO | WO-2016/104174 | 6/2016 |

OTHER PUBLICATIONS

Written Opinion (Application No. PCT/IB2018/053785) dated Jul. 17, 2018.

* cited by examiner

FIG. 18A1
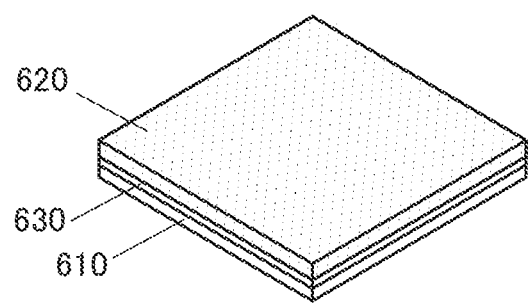
FIG. 18B1
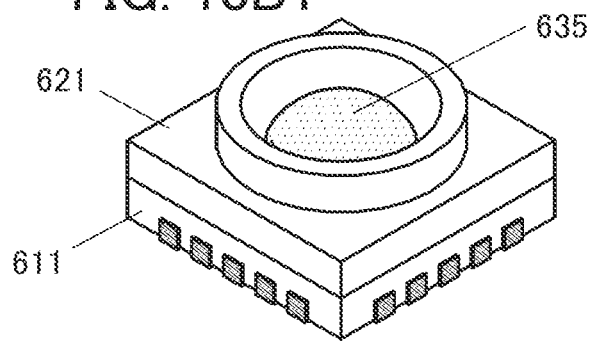
FIG. 18A2
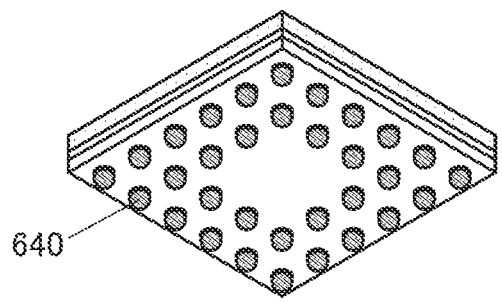
FIG. 18B2
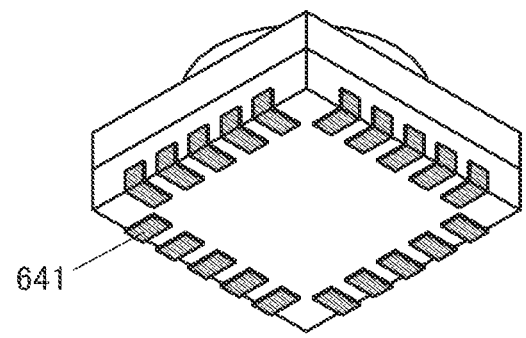
FIG. 18A3
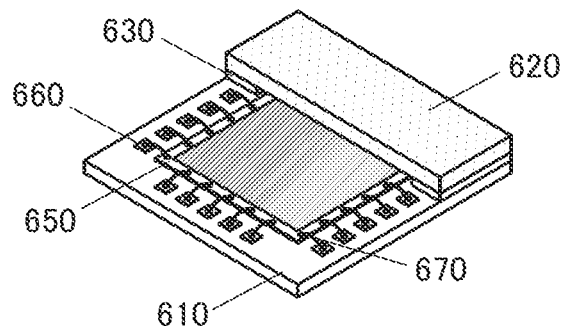
FIG. 18B3
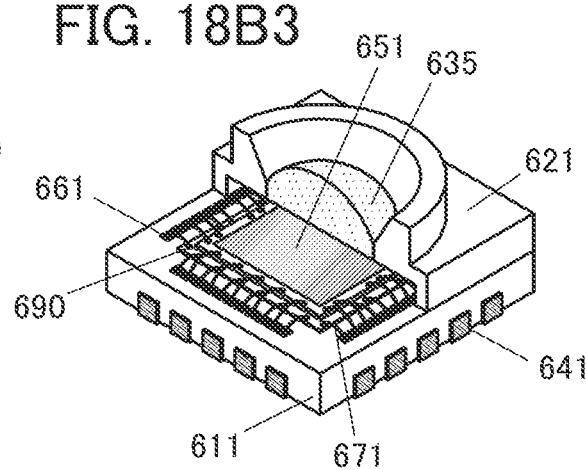

IMAGING DEVICE INCLUDING PHOTOELECTRIC CONVERSION ELEMENT AND TRANSISTOR

CROSS REFERENCE TO RELATED APPLICATIONS

This application is a U.S. National Phase Application under 35 U.S.C. § 371 of International Application PCT/IB2018/053785, filed on May 29, 2018, which is incorporated by reference, and which claims the benefit of a foreign priority application filed in Japan on Jun. 8, 2017, as Application No. 2017-113393.

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Thus, more specifically, a semiconductor device, a display device, a liquid crystal display device, a light-emitting device, a lighting device, a power storage device, a memory device, an imaging device, a driving method thereof, or a manufacturing method thereof can be given as an example of the technical field of one embodiment of the present invention disclosed in this specification.

Note that in this specification and the like, a semiconductor device refers to all devices that can function by utilizing semiconductor characteristics. A transistor and a semiconductor circuit are embodiments of semiconductor devices. Furthermore, in some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

A technique for adding an arithmetic function to an imaging device is disclosed in Patent Document 2.

Prior Art Document

Patent Document

[Patent Document 1] Japanese Published Patent Application No. 2011-119711
[Patent Document 2] Japanese Published Patent Application No. 2016-123087

SUMMARY OF THE INVENTION

Problems to be Solved by the Invention

In a solid-state imaging element such as a CMOS image sensor, a method in which a data potential obtained by photoelectric conversion is held in a charge accumulation portion in a pixel is often employed. The method has problems such as charge leakage from the charge accumulation portion and noise contamination caused by reading-out, and a novel operation method is desired to be suggested.

After the data potential (analog data) is converted into digital data and extracted to the outside, processing of image data compression, image recognition, and the like is performed. If such processing can be performed in the imaging device, the conjunction with an external device is performed at a higher speed, so that the convenience of a user is improved. Furthermore, load and power consumption of a peripheral device or the like can be reduced.

Therefore, an object of one embodiment of the present invention is to provide an imaging device that is less likely to be affected by noise. Another object is to provide an imaging device capable of executing image processing. Another object is to provide an imaging device capable of recognizing obtained image data. Another object is to provide an imaging device capable of compressing obtained image data.

Another object is to provide an imaging device with low power consumption. Another object is to provide an imaging device capable of capturing an image with high sensitivity. Another object is to provide an imaging device with high reliability. Another object is to provide a novel imaging device or the like. Another object is to provide a method of driving the above imaging device. Another object is to provide a novel semiconductor device or the like.

Note that the descriptions of these objects do not disturb the existence of other objects. One embodiment of the present invention does not need to achieve all the objects. Other objects will be apparent from and can be derived from the descriptions of the specification, the drawings, the claims, and the like.

Means for Solving the Problems

One embodiment of the present invention relates to an imaging device including a pixel that converts photoelectric conversion operation into a pulse signal. Another embodiment of the present invention relates to an imaging device capable of performing arithmetic processing on imaging data.

One embodiment of the present invention is an imaging device including a first photoelectric conversion element, a first transistor, a second transistor, a first inverter circuit, and a second inverter circuit, in which one of electrodes of the first photoelectric conversion element is electrically connected to an input terminal of the first inverter circuit, an output terminal of the first inverter circuit is electrically connected to a gate of the first transistor, the output terminal of the first inverter circuit is electrically connected to an input terminal of the second inverter circuit, an output terminal of the second inverter circuit is electrically connected to a gate of the second transistor, one of a source and a drain of the first transistor is electrically connected to the input terminal of the first inverter circuit, one of a source and a drain of the second transistor is electrically connected to the input terminal of the first inverter circuit, and the polarity of the first transistor is opposite to the polarity of the second transistor.

The imaging device may include a third transistor. One of a source and a drain of the third transistor may be electrically connected to the one of the electrodes of the first photoelectric conversion element, and the other of the source and drain of the third transistor may be electrically connected to the input terminal of the first inverter circuit.

The imaging device may include a first capacitor and a second capacitor. One of electrodes of the first capacitor may be electrically connected to the input terminal of the first inverter circuit, and one of electrodes of the second capacitor may be electrically connected to the output terminal of the second inverter circuit.

The imaging device may further include a fourth transistor. One of a source and a drain of the fourth transistor may be electrically connected to the output terminal of the second inverter circuit.

The other of the source and the drain of the fourth transistor can be electrically connected to a counter circuit.

Another embodiment of the present invention is an imaging device including a first circuit, a second circuit, a third circuit, a fourth circuit, and a fifth circuit, in which the first circuit is configured to generate a first pulse signal with a period in accordance with the intensity of light, the second circuit is configured to hold an arbitrary potential signal and to output a second pulse signal by multiplying the first pulse signal by the arbitrary potential signal, the third circuit is configured to accumulate electric charges equivalent to electric charges output as the second pulse signal, the fourth circuit is configured to generate a third pulse signal with a period in accordance with the amount of the accumulated electric charges, the fifth circuit is configured to convert the third pulse signal into n-bit (n is a natural number) digital data, and the third circuit is configured to add or subtract an electric charge output as the second pulse signal when the number of the second circuits is plural.

The second circuit may include a fifth transistor and a sixth transistor. One of a source and a drain of the fifth transistor can be electrically connected to a gate of the sixth transistor.

Another embodiment of the present invention is an imaging device including a first pixel block and a neural network, in which the first pixel block includes a second pixel block, a current mirror circuit, a pulse generation circuit, and a counter circuit, the second pixel block is electrically connected to an input-side transistor of the current mirror circuit, an output-side transistor of the current mirror circuit is electrically connected to an input terminal of the pulse generation circuit, an output terminal of the pulse generation circuit is electrically connected to the counter circuit, and the counter circuit is electrically connected to the neural network.

The second pixel block may include a pixel and an arithmetic unit. The pixel is configured to generate a pulse signal with a period in accordance with the intensity of light, and the arithmetic unit is configured to multiply the pulse signal by a desired magnification and outputting the signal.

The arithmetic unit may include a seventh transistor, an eighth transistor, a ninth transistor, and a third capacitor. One of a source and a drain of the seventh transistor can be electrically connected to one of electrodes of the third capacitor. The one of the electrodes of the third capacitor can be electrically connected to a gate of the eighth transistor. One of a source and a drain of the eighth transistor can be electrically connected to one of a source and a drain of the ninth transistor. A gate of the ninth transistor can be electrically connected to the pixel. The other of the source and the drain of the eighth transistor can be electrically connected to the input-side transistor of the current mirror circuit.

The pixel may include a second photoelectric conversion element, a tenth transistor, an eleventh transistor, a third inverter circuit, and a fourth inverter circuit. One of electrodes of the second photoelectric conversion element can be electrically connected to an input terminal of the third inverter circuit. An output terminal of the third inverter circuit can be electrically connected to a gate of the tenth transistor. The output terminal of the third inverter circuit can be electrically connected to an input terminal of the fourth inverter circuit. An output terminal of the fourth inverter circuit can be electrically connected to a gate of the eleventh transistor. One of a source and a drain of the tenth transistor can be electrically connected to the input terminal of the third inverter circuit. One of a source and a drain of the eleventh transistor can be electrically connected to the input terminal of the third inverter circuit. The polarity of the tenth transistor can be opposite to the polarity of the eleventh transistor.

The imaging device may include a twelfth transistor. One of a source and a drain of the twelfth transistor may be electrically connected to the one of the electrodes of the second photoelectric conversion element, and the other of the source and the drain of the twelfth transistor may be electrically connected to the input terminal of the third inverter circuit.

The imaging device may include a fourth capacitor and a fifth capacitor. One of electrodes of the fourth capacitor may be electrically connected to the input terminal of the third inverter circuit. One of electrodes of the fifth capacitor may be electrically connected to the output terminal of the fourth inverter circuit.

It is preferable that the third transistor, the fifth transistor, the seventh transistor, and the twelfth transistor each include a metal oxide in a channel formation region and that the metal oxide include In, Zn, and M(M is Al, Ti, Ga, Sn, Y, Zr, La, Ce, Nd, or Hf).

It is preferable that the first photoelectric conversion element and the second photoelectric conversion element each include selenium or a compound containing selenium.

Effect of the Invention

With the use of one embodiment of the present invention, an imaging device that is less likely to be affected by noise can be provided. An imaging device capable of executing image processing can be provided. An imaging device capable of recognizing obtained image data can be provided. An imaging device capable of compressing obtained image data can be provided.

An imaging device with low power consumption can be provided. An imaging device capable of capturing an image with high sensitivity can be provided. An imaging device with high reliability can be provided. A novel imaging device or the like can be provided. A method of driving the above imaging device can be provided. A novel semiconductor device or the like can be provided.

BRIEF DESCRIPTION OF THE DRAWINGS

FIGS. 18A1-18B3 Perspective views of a package and a module each including an imaging device.

MODE FOR CARRYING OUT THE INVENTION

Figure 1:
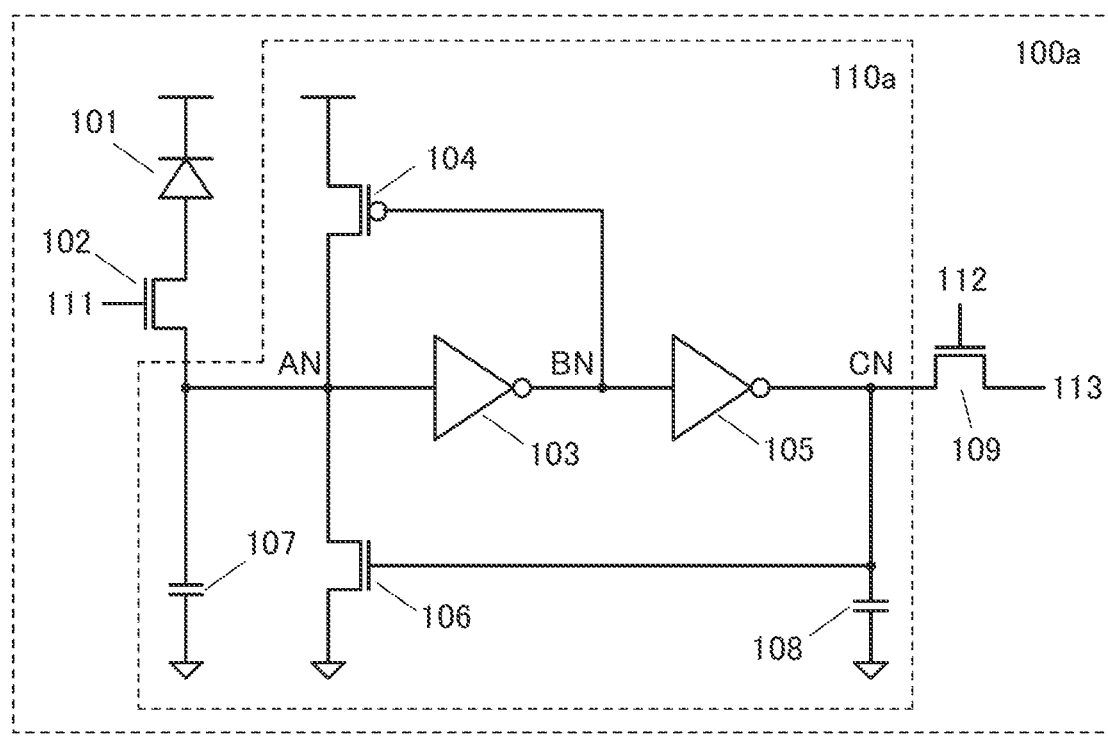
FIG. 1 A diagram illustrating a pixel circuit.

Embodiments will be described in detail with reference to the drawings. Note that the present invention is not limited to the following description, and it will be easily understood by those skilled in the art that the modes and details can be modified in various ways without departing from the spirit and the scope of the present invention. Therefore, the present invention should not be interpreted as being limited to the description of the following embodiments. Note that in structures of the invention described below, the same reference numerals are used, in different drawings, for the same portions or portions having similar functions, and description thereof is not repeated in some cases. Note that the hatching of the same element that constitutes a drawing is omitted or changed in different drawings in some cases.

Embodiment 1

In this embodiment, an imaging device of one embodiment of the present invention will be described with reference to drawings.

One embodiment of the present invention is an imaging device that can convert imaging data into a pulse signal and can output the pulse signal. A data potential generated by the photoelectric conversion operation is input to a pulse generation circuit to output a pulse signal having a spike waveform.

In the imaging device, the imaging data is not easily degraded by electric charge leakage, unlike in a structure in which a data potential held in a pixel is read out. Not an analog potential but a pulse signal is read out; thus, the imaging device is less likely to be affected by noise. Signals for controlling reset operation and accumulation operation are not necessary, and a peripheral circuit can be simplified. The pulse signal can be directly taken into a counter circuit, so that conversion into digital data can be performed at a high speed.

In addition, a structure in which product-sum operation of pulse signals output from pixels is performed is provided, and digital data can be generated from a new pulse signal. The digital data is taken into a neural network or the like, whereby processing such as image recognition can be performed. Processing up to taking an enormous amount of image data into a neural network or the like can be performed in the imaging device; thus, processing can be efficiently performed.

FIG. 1 is a diagram illustrating a pixel circuit of an imaging device of one embodiment of the present invention. A pixel 100a includes a photoelectric conversion element 101, a transistor 102, a pulse generation unit 110a, and a transistor 109.

The pulse generation unit 110a includes an inverter circuit 103, an inverter circuit 105, a transistor 104, a transistor 106, a capacitor 107, and a capacitor 108. Note that a configuration without the capacitors 107 and 108 may be employed.

An input terminal of the inverter circuit 103 is electrically connected to one electrode of the capacitor 107. An output terminal of the inverter circuit 103 is electrically connected to a gate of the transistor 104. One of a source and a drain of the transistor 104 is electrically connected to the input terminal of the inverter circuit 103. The output terminal of the inverter circuit 103 is electrically connected to an input terminal of the inverter circuit 105. An output terminal of the inverter circuit 105 is electrically connected to a gate of the transistor 106. One of a source and a drain of the transistor 106 is electrically connected to the input terminal of the inverter circuit 103. The output terminal of the inverter circuit 105 is electrically connected to one electrode of the capacitor 108.

Here, a point at which the input terminal of the inverter circuit 103, the one of the source and the drain of the transistor 104, the one of the source and the drain of the transistor 106, and the one electrode of the capacitor 107 are connected is referred to as a node AN. The node AN corresponds to an input terminal of the pulse generation unit 110a.

A point at which the output terminal of the inverter circuit 103, the input terminal of the inverter circuit 105, and the gate of the transistor 104 are connected is referred to as a node BN.

The output terminal of the inverter circuit 105, the gate of the transistor 106, and the one electrode of the capacitor 108 are connected is referred to as a node CN. The node CN corresponds to an output terminal of the pulse generation unit 110a.

One electrode of the photoelectric conversion element 101 is electrically connected to one of a source and a drain of the transistor 102. The other of the source and the drain of the transistor 102 is electrically connected to the input terminal of the pulse generation unit 110a.

One of a source and a drain of the transistor 109 is electrically connected to the output terminal of the pulse generation unit 110a.

A gate of the transistor 102 is electrically connected to a wiring 111. A gate of the transistor 109 is electrically connected to a wiring 112. The other of the source and the drain of the transistor 109 is electrically connected to the wiring 113. The other electrode of the photoelectric conversion element 101 and the other of the source and the drain of the transistor 104 are electrically connected to a power supply line that supplies a high potential, for example. The other of the source and the drain of the transistor 106, the other electrode of the capacitor 107, and the other electrode of the capacitor 108 are electrically connected to a power supply line that supplies a GND potential or the like, for example.

The wiring 111 and the wiring 112 can function as a signal line for controlling the on/off of each transistor. The wiring 113 can function as an output line.

As the photoelectric conversion element 101, a photodiode can be used. Alternatively, as the photoelectric conversion element 101, a photoconductor whose resistance is changed depending on light intensity may be used. In order to increase light detection sensitivity at low illuminance, an avalanche photodiode is preferably used.

The transistor 102 has a function of controlling the output operation of the pixel 100*a*. When the transistor 102 is off, the pulse signal is not output from the pixel 100*a*. Note that the transistor 102 may be always on.

The transistor 102 also has a function of controlling the potential of the node AN. In the case where an avalanche photodiode is used as the photoelectric conversion element 101, a high voltage needs to be applied to the cathode side. Thus, the anode side may have a potential equivalent to that of the cathode side, in which case a high voltage is also applied to the transistors 104 and 106 and the transistors included in the inverter circuit 103.

The pulse generation unit 110*a*, which includes an inverter circuit, is preferably formed with a combination of transistors with different polarities. Therefore, the transistor is preferably formed of a transistor including silicon in a channel formation region (hereinafter referred to as a Si transistor). Note that a miniaturized Si transistor might have an insufficient withstand voltage and thus might be decreased in reliability when high voltage is applied.

Therefore, to limit the potential of the node AN, the transistor 102 with a high withstand voltage is provided. As the transistor with a high withstand voltage, for example, a transistor using a metal oxide in a channel formation region (hereinafter, an OS transistor) or the like can be used.

Although a high voltage may be applied to the one of the source and the drain of the transistor 102, application of an appropriate gate voltage can inhibit an increase in the potential of the other of the source and the drain (the node AN). For example, when the maximum potential of the node AN is set to approximately 1.5 V, the potential of the wiring 111 may be set to 1.5 V+the threshold voltage ($V_{th}$) of the transistor 102. Note that in the case where a high voltage is not applied to the photoelectric conversion element 101, the transistor 102 can be omitted.

Figure 8A:
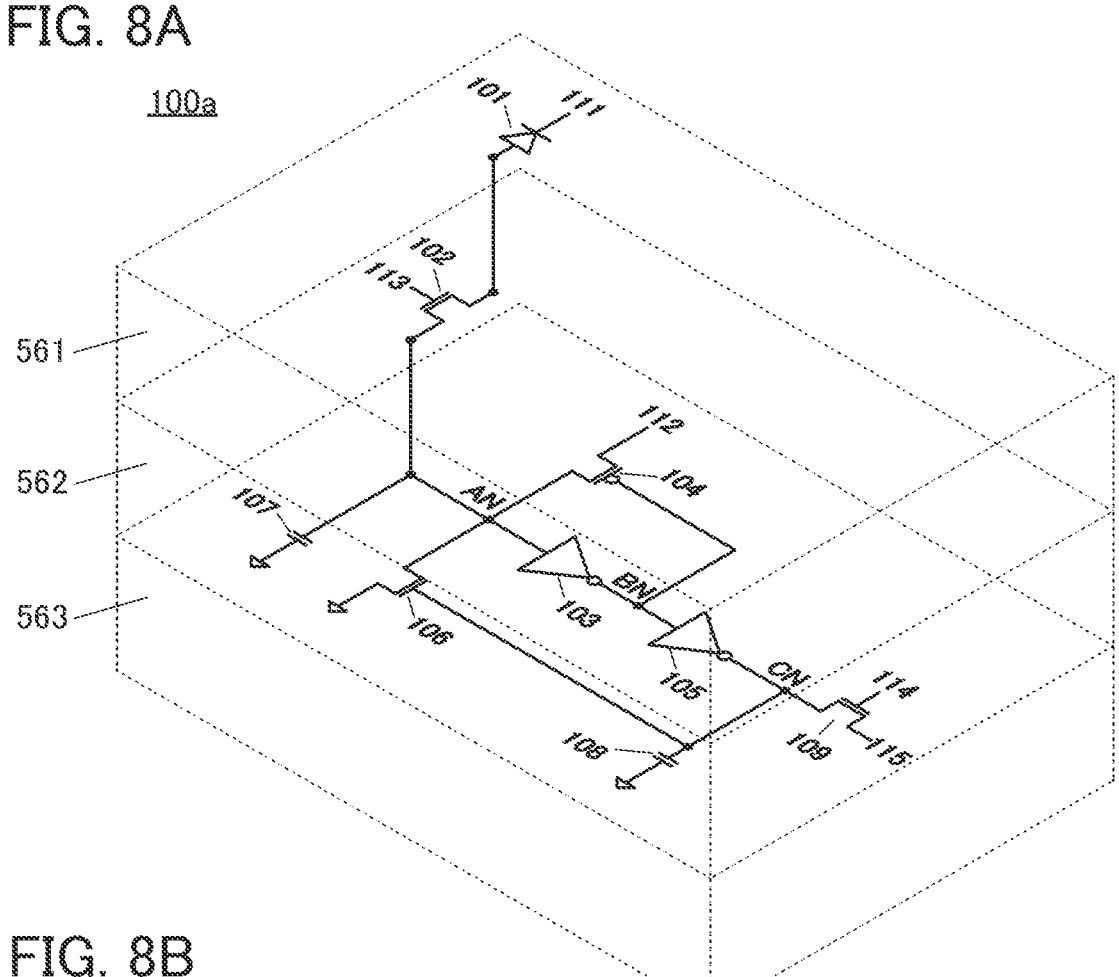
FIGS. 8A and 8B A diagram illustrating a pixel and a diagram illustrating a pixel block.

Si transistors, an OS transistor, and a photoelectric conversion element which are included in the pixel 100*a* can be formed in the layers 563, 562, and 561 to be stacked, as shown in FIG. 8(A). Note that although FIG. 8(A) shows the circuit diagram for simplicity, the photoelectric conversion element, the Si transistors, and the OS transistor can actually be provided to have an overlapped region. Consequently, the area of the pixel can be reduced. Furthermore, the photoelectric conversion element can overlap with substantially the entire pixel region, and the aperture ratio of the light-receiving portion can be increased.

Although only the transistor 102 is provided as an OS transistor in the layer 562 in FIG. 8(A), some other components may be OS transistors. For example, the transistors 106 and 109 and n-channel transistors included in the inverter circuits 103 and 105 may be formed as OS transistors provided in the layer 562. Although the capacitors 107 and 108 are provided in the layer 563, they may be provided in the layer 562.

Figure 2:
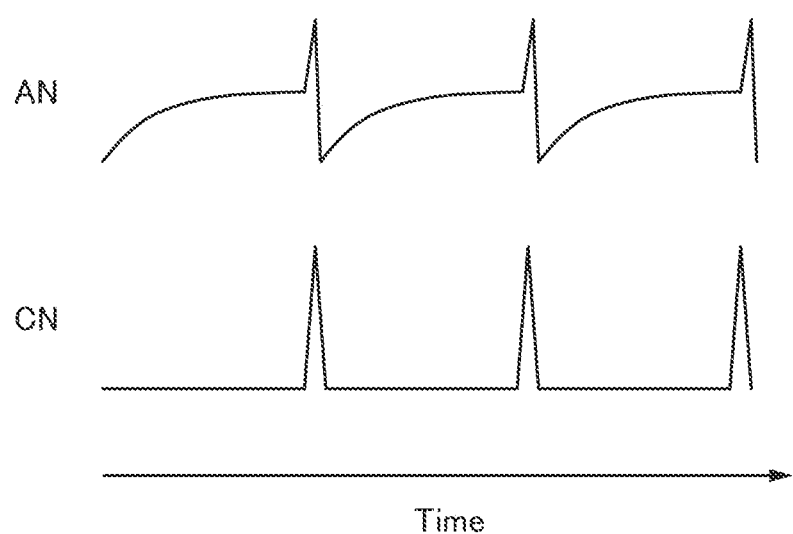
FIG. 2 A diagram illustrating potential changes at a node AN and a node CN of a pixel.

FIG. 2 is a diagram showing changes in the potentials of the node AN and the node CN at the time of operation of the pixel 100*a*. The operation of the pulse generation unit 110*a* is described with reference to FIG. 1 and FIG. 2.

First, the potential of the node AN is gradually increased by photoelectric conversion. The change in the potential of the node AN at this time depends on the photoelectric conversion characteristics of the photoelectric conversion element 101, the electric characteristics of the transistor 102, the capacitance value of the capacitor 107, and the like.

When the potential of the node AN increases to a certain value, the inverter circuit 103 operates and the potential of the node BN reaches the threshold voltage of the transistor 104. At this time, the transistor 104 is turned on, and the potential of the node AN rapidly increases.

When the potential of the node BN rapidly decreases in response to a rapid rise in the potential of the node AN, the inverter circuit 105 operates and the potential of the node CN increases rapidly. When the potential of the node CN rapidly increases, the transistor 106 is turned on, and the potential of the node AN rapidly decreases.

In accordance with a rapid decrease in the potential of the node AN, the potential of the node BN rapidly increases and the potential of the node CN rapidly decreases. The change in the potential of the node CN also depends on the capacitance value of the capacitor 108 and the like.

Therefore, the potential of the node CN decreases rapidly just after increasing rapidly. That is, the potential change at the node CN has a spike waveform.

The above operation is repeated, whereby a pulse signal having a spike waveform shown in FIG. 2 can be generated. For example, the pulse width can be several nanoseconds to several tens of nanoseconds. Note that generation of a pulse signal in a pixel can be regarded as generation of a digital signal. Thus, even when transistors included in the pixels generate a faint noise, that is less likely to have an impact.

The transistor 109 can have a function of selecting the pixel 100*a*. The transistor 109 is turned on, whereby a pulse signal generated by the above operation can be output to the wiring 113. Note that the potential of the node AN increases more rapidly as the light intensity is higher. Thus, the higher the light intensity is, the higher the frequency of the output pulse signal is.

Figure 3A:
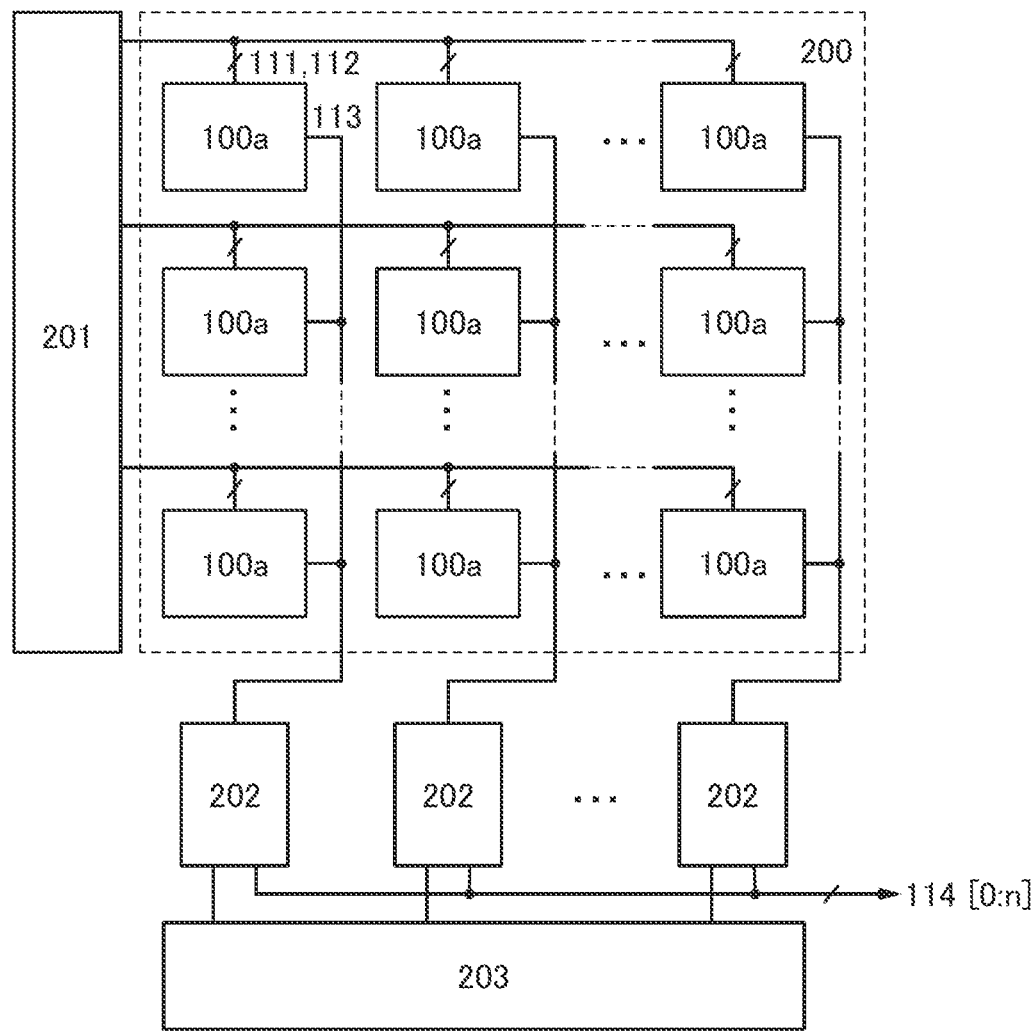
FIGS. 3A and 3B A block diagram of an imaging device and a diagram illustrating a counter circuit.
Figure 3B:
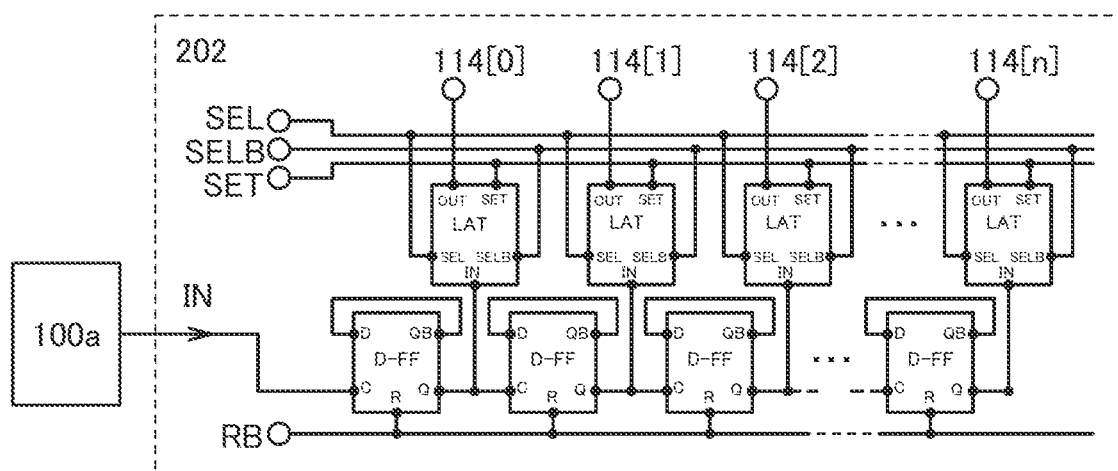

FIG. 3 is a block diagram of an imaging device of one embodiment of the present invention, and includes a pixel array 200, a circuit 201, circuits 202, and a circuit 203. The pixel array 200 includes the pixels 100*a* arranged in a matrix.

The circuit 201 can have a function of a row driver. For the circuit 201, a decoder or a shift register can be used, for example. The row where reading-out is performed is selected by the circuit 201, and a pulse signal generated in the pixel 100*a* can be output to the wiring 113. Note that although FIG. 3 shows a configuration example in which the circuit 201 is connected to the wirings 111 and 112, the circuit 201 may control only the wiring 112.

The circuit 202 can have a function of a read circuit. As the circuit 202, an n-bit (n is a natural number) counter circuit including D-FFs (e.g., D flip flops) shown in FIG. 3(B) can be used, for example. A pulse signal output from the pixel 100*a* selected by the circuit 201 is input to the D-FF in the first stage and is counted for a certain period. The counter circuit is reset by an RB signal and can start counting again. A SET signal is input, whereby the count value is transferred to a LAT circuit. When the SET signal and the SELB signal are input, the value stored in the LAT circuit is output to a wiring 114. Note that the counter circuit is not limited to an asynchronous one but may be a synchronous one.

The circuit 203 can have a function of a column driver. For the circuit 203, a decoder or a shift register can be used, for example. The circuit 203 can select a column where reading-out is performed and digital data generated in the circuit 202 can be output to the wiring 114.

With the above structure, image data can be obtained.

Figure 4:
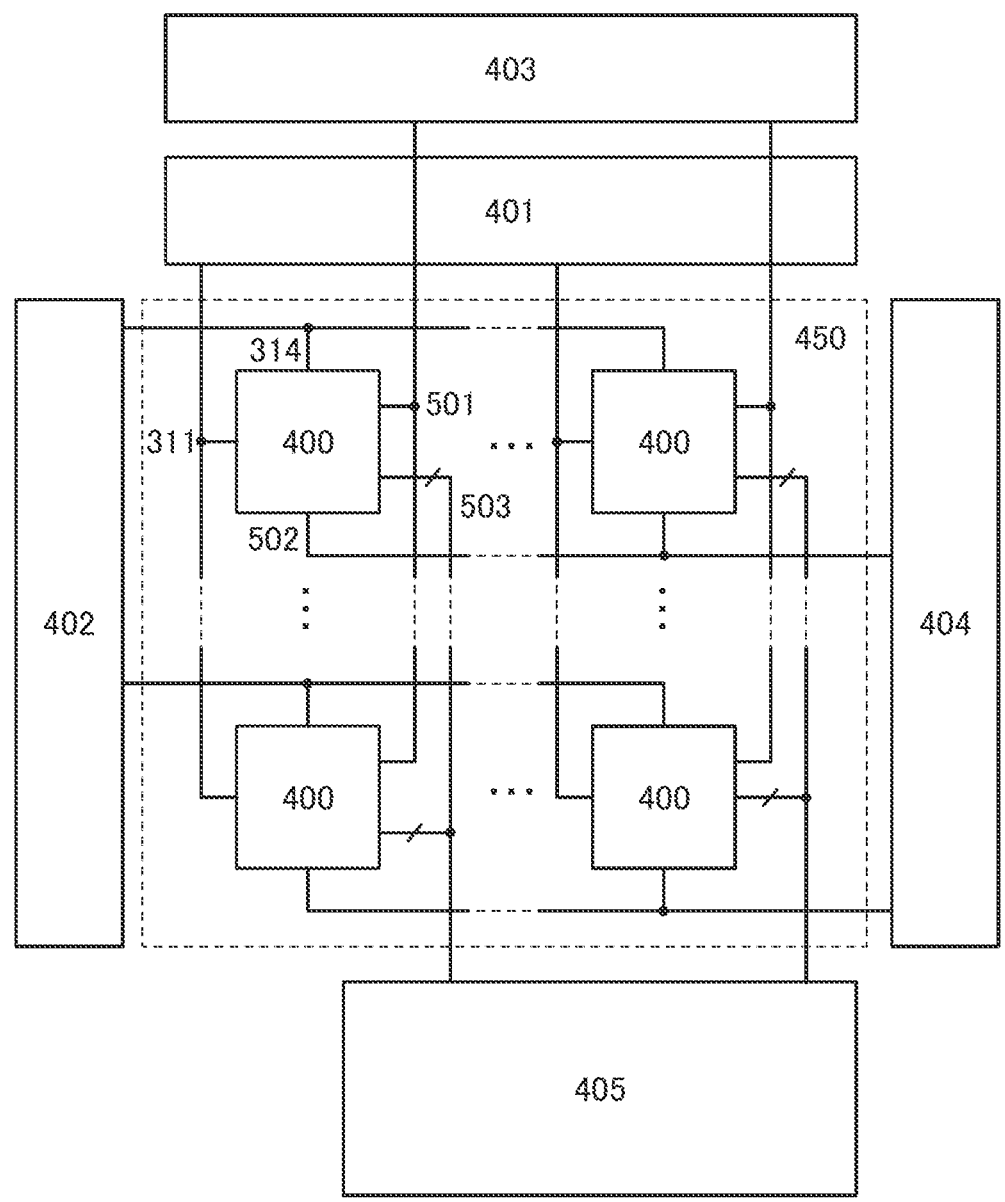
FIG. 4 A block diagram of an imaging device.

The imaging device of one embodiment of the present invention may have a configuration of a block diagram shown in FIG. 4. In the imaging device shown in FIG. 4, a pulse signal can be generated by the same operation as that of the above-described pixel 100a, and the product-sum operation can be performed by multiplying the pulse signal by an arbitrary weight coefficient. The result of the product-sum operation is taken into a neural network, whereby the processing such as image recognition can be performed.

The imaging device shown in FIG. 4 includes a pixel array 450, a circuit 401, a circuit 402, a circuit 403, a circuit 404, and a circuit 405. Note that the circuits 401 to 405 do not necessarily have the same circuit configuration but may be composed of a plurality of circuits.

Figure 5A:
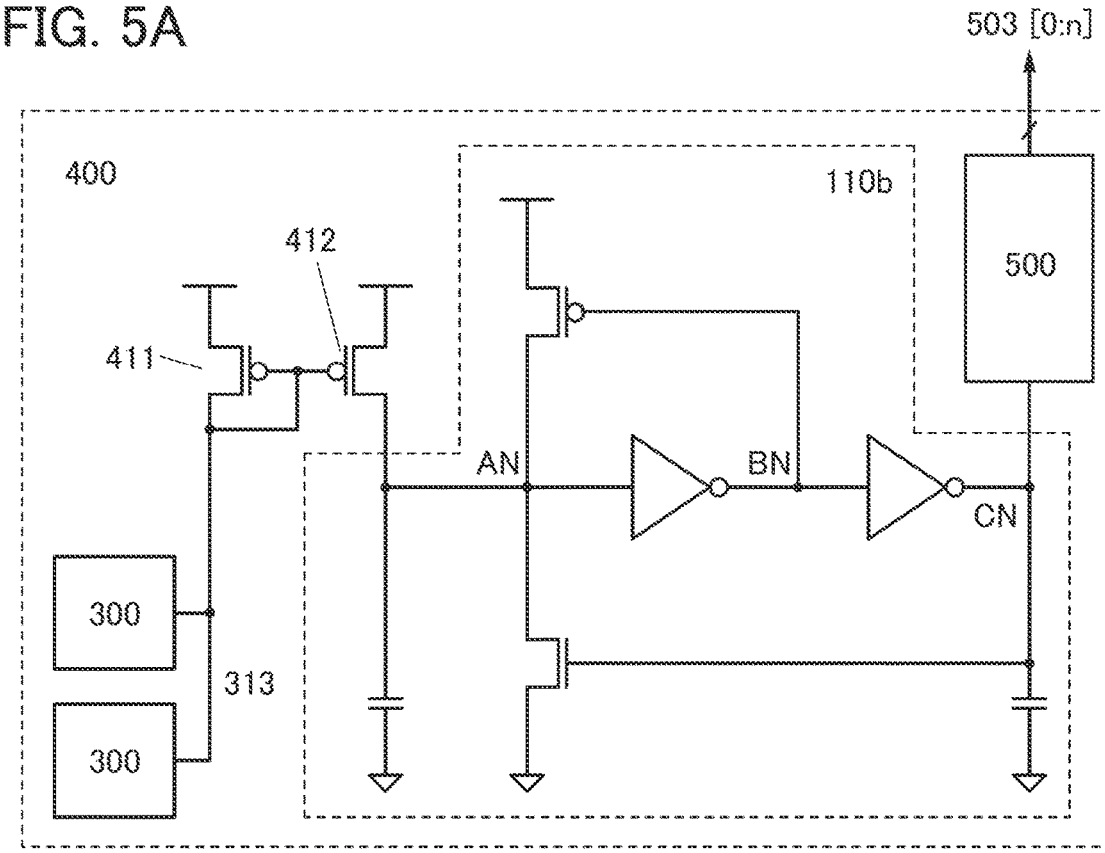
FIGS. 5A and 5B A diagram illustrating a pixel block and a diagram illustrating a counter circuit.

The pixel array 450 includes a plurality of first pixel blocks 400 arranged in a matrix. As shown in FIG. 5(A), the first pixel block 400 includes a plurality of second pixel blocks 300, a current mirror circuit, a pulse generation unit 110b, and a read circuit 500. Note that FIG. 5(A) shows an example in which the number of second pixel blocks 300 is two; however, the number thereof is not limited.

An output line of the second pixel block 300 is electrically connected to an input-side transistor of the current mirror circuit. The input terminal (the node AN) of the pulse generation unit 110b is electrically connected to an output-side transistor of the current mirror circuit. The output terminal (the node CN) of the pulse generation unit 110b is electrically connected to the read circuit 500.

Figure 6A:
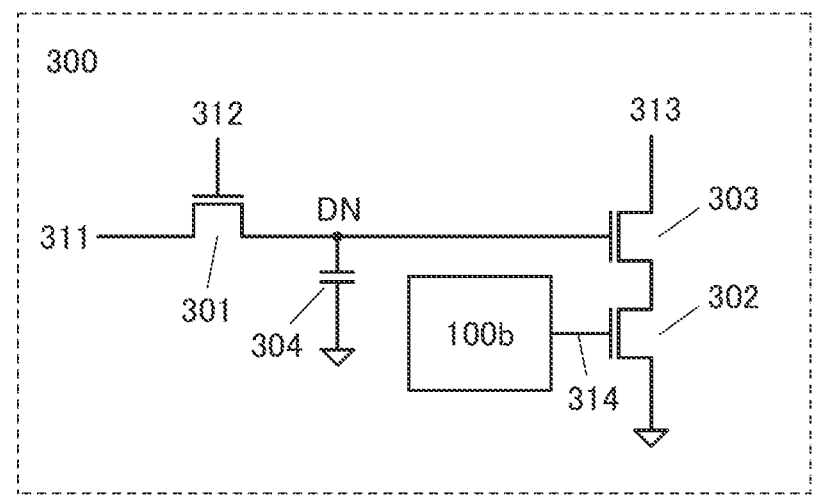
FIGS. 6A and 6B A diagram illustrating a pixel block and a diagram illustrating a pixel.

As shown in FIG. 6(A), the second pixel block 300 includes a pixel 100b, transistors 301, 302, and 303, and a capacitor 304. The transistors 301, 302, and 303 and the capacitor 304 constitute an arithmetic unit in which the output of the pixel 100b is multiplied by the weight coefficient. Note that instead of the pixel 100b, the first pixel block 400 may be connected to the arithmetic unit.

Figure 6B:
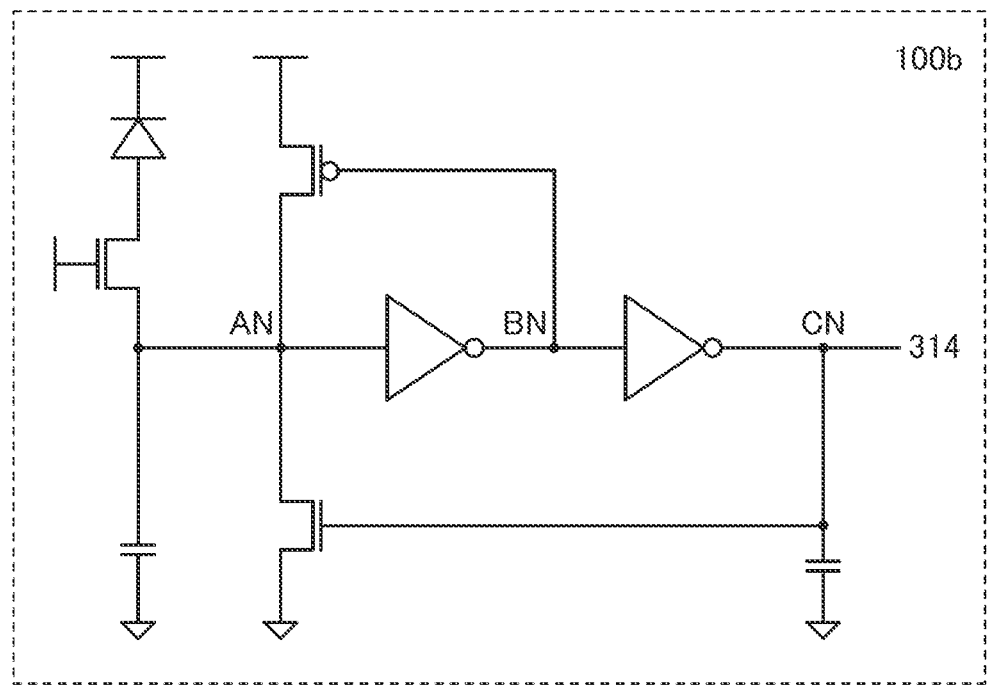

The pixel 100b can have a configuration shown in FIG. 6(B). The pixel 100b can have a configuration in which the transistor 109 is omitted from the pixel 100a shown in FIG. 1.

One of a source and a drain of the transistor 301 is electrically connected to one electrode of the capacitor 304. The one electrode of the capacitor 304 is electrically connected to a gate of the transistor 303. One of a source and a drain of the transistor 303 is electrically connected to one of a source and a drain of the transistor 302.

The other of the source and the drain of the transistor 301 is electrically connected to a wiring 311. A gate of the transistor 301 is electrically connected to a wiring 312. The other of the source and the drain of the transistor 303 is electrically connected to a wiring 313. A gate of the transistor 302 is electrically connected to a wiring 314. The other of the source and the drain of the transistor 302 and the other electrode of the capacitor 304 are electrically connected to a power supply line that supplies the GND potential or the like, for example.

Here, a point at which the one of the source and the drain of the transistor 301, the one electrode of the capacitor 304, and the gate of the transistor 303 are connected is referred to as a node DN.

The wiring 311 can have a function of supplying a potential to be written to the node DN. The potential corresponds to a weight coefficient. The wiring 312 can have a function of a signal line that controls the on/off of the transistor 301. The wiring 313 can have a function of an output line for outputting a signal from the pixel block 300.

The wiring 314 can have a function of an output line that outputs a signal from the pixel 100b.

The wiring 311 can be electrically connected to the circuit 401. The wiring 312 can be electrically connected to the circuit 402. The circuit 401 can have a function of a column driver. The circuit 402 can have a function of a row driver. For the circuit 401 and the circuit 402, a decoder or a shift register can be used.

For the transistor 301, an OS transistor with a small off-state current is preferably used in order to hold the potential written to the node DN. As the transistors 302 and 303, Si transistors are preferably used because high-speed operation and a high amplification factor are required.

Figure 8B:
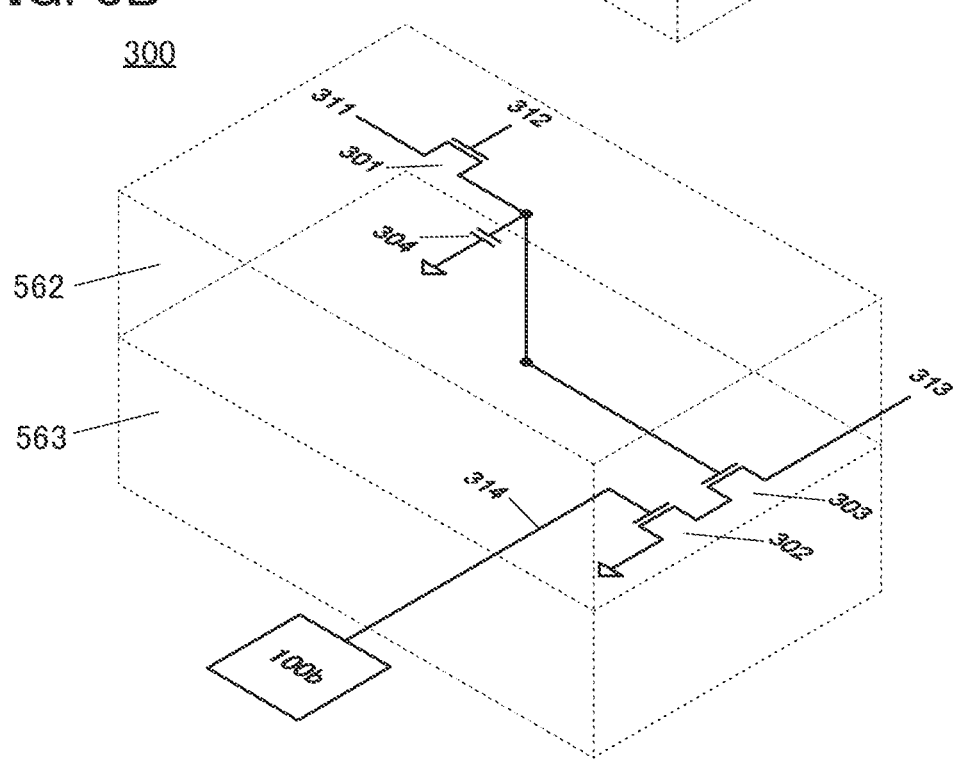

The Si transistors and the OS transistor included in the second pixel block 300 can be formed in the layers 563 and 562, respectively, and stacked as shown in FIG. 8(B). Note that although FIG. 8(B) shows the circuit diagram for simplicity, in practice, the Si transistors and the OS transistor can be formed to have an overlapped region. Thus, the area of the pixel can be reduced.

Although only the transistor 301 is provided as an OS transistor in the layer 562 in FIG. 8(B), some other components may be OS transistors. For example, one or both of the transistor 302 and the transistor 303 may be formed as an OS transistor(s). The capacitor 304 is provided in the layer 562, but may be provided in the layer 563.

The on/off of the transistor 302 depends on a pulse signal supplied from the pixel 100b, and the on/off of the transistor 303 depends on the potential of the node DN. The power consumption can be reduced because consumption current is intermittent in accordance with pulse signals.

The potential of the node DN is preferably within the range where the transistor 303 operates in the subthreshold region. A current value can be reduced due to the operation in the subthreshold region, so that power consumption can be reduced.

Here, the value written to the node DN is log(W). W corresponds to a weight coefficient. In the case where the transistor operates in the subthreshold region, the current can be approximated to $I=kW$ (k is a proportionality constant). When the number of pulses output from the pixel 100b is n and the pulse width is t, electric charge flowing can be approximated to $Q=nIt=n\cdot t\cdot k\cdot W$. Since n corresponds to image data, the product of the image data and an arbitrary weight coefficient can be obtained.

Since the first pixel block 400 includes a plurality of second pixel blocks 300, the sum of current flowing through the second pixel blocks 300 flow through the input-side transistor (the transistor 411) of the current mirror circuit which is composed of the transistor 411 and the transistor 412.

A similar amount of current flows through the output-side transistor (the transistor 412) of the current mirror circuit, and the potential of the node AN in the pulse generation unit 110b increases. The pulse generation unit 110b can have the same configuration as the pulse generation unit 110a shown in FIG. 1. Thus, a pulse signal including components of the arithmetic operation of the image data of the plurality of pixels 100b is output to the node CN in the pulse generation unit 110b.

Figure 5B:
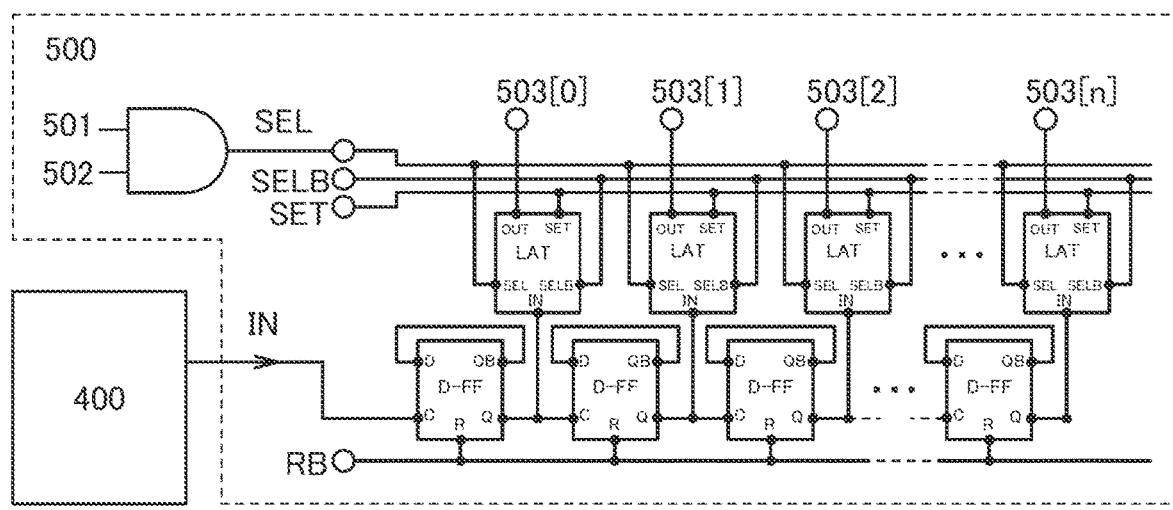

The node CN in the pulse generation unit 110b is electrically connected to the read circuit 500 shown in FIG. 5(B). A counter circuit using D-FFs that is similar to the read circuit 202 shown in FIG. 3(B) can be used for the read circuit 500. Note that reading-out is performed for each of the first pixel blocks 400, and an output signal of an AND circuit is used as an SEL signal, for example. Note that a signal RB and a signal SET may be supplied to all pixels simultaneously.

The circuit 403 can be connected to a first input terminal of the AND circuit through a wiring 501. The circuit 404 can be connected to a second input terminal of the AND circuit through a wiring 502. The circuit 403 can have a function of a column driver. The circuit 404 can have a function of a row driver. A decoder or a shift register can be used for the circuit 403 and the circuit 404.

The read circuit 500 selected by an output signal of the AND circuit can output the generated digital data to a wiring 503. Note that the digital data includes image data information that is output from the plurality of pixels 100b and arbitrary n-bit data is output; thus, it can be said that an image is compressed.

Figure 7A:
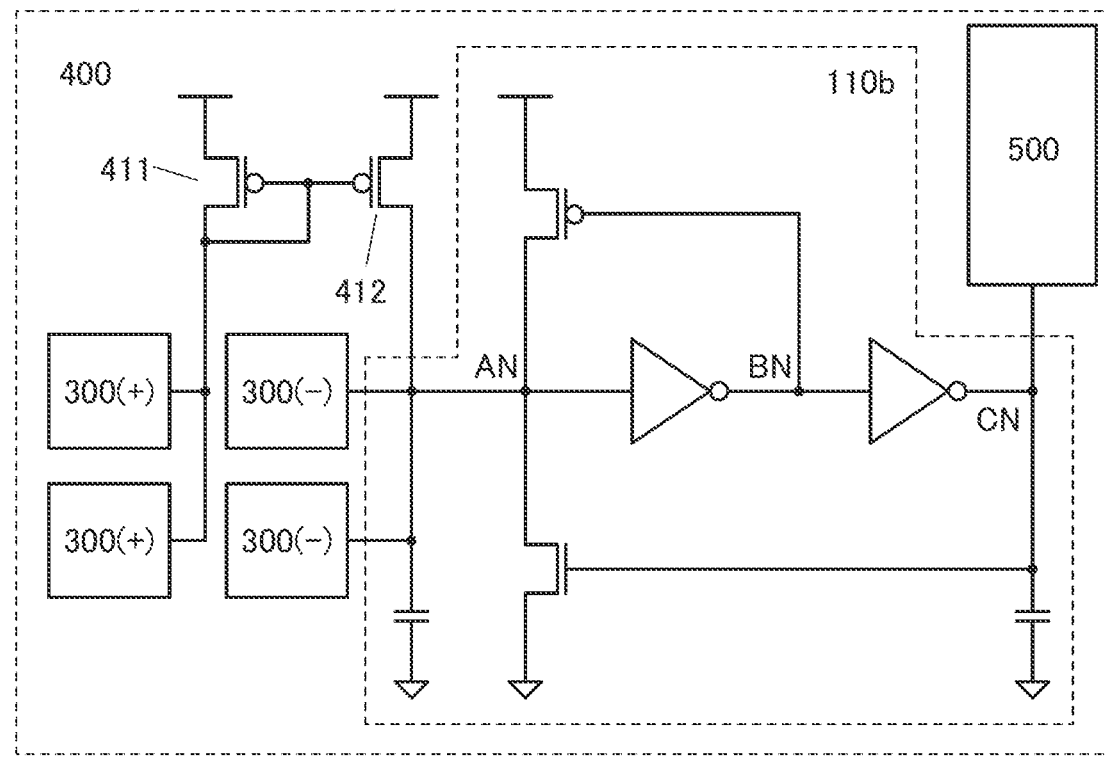
FIGS. 7A and 7B diagram illustrating a pixel block and a diagram illustrating a pixel.

The first pixel block 400 can have a configuration shown in FIG. 7(A). The first pixel block 400 shown in FIG. 7(A) can perform not only product-sum operation but also product-difference operation. By connecting the second pixel block 300 to the output-side transistor (the transistor 412) of the current mirror circuit as well, the current generated in the second pixel block 300 can be subtracted from a mirror current obtained by the product-sum operation. That is, the potential of the node AN is determined depending on the product-sum operation and the product-difference operation.

Note that since a weight coefficient input to each of the second pixel blocks 300 is arbitrary, current does not flow through the second pixel blocks 300 to which 0 is input as the weight coefficient. Therefore, only one of the product-sum operation and the product-difference operation may be performed.

Figure 7B:
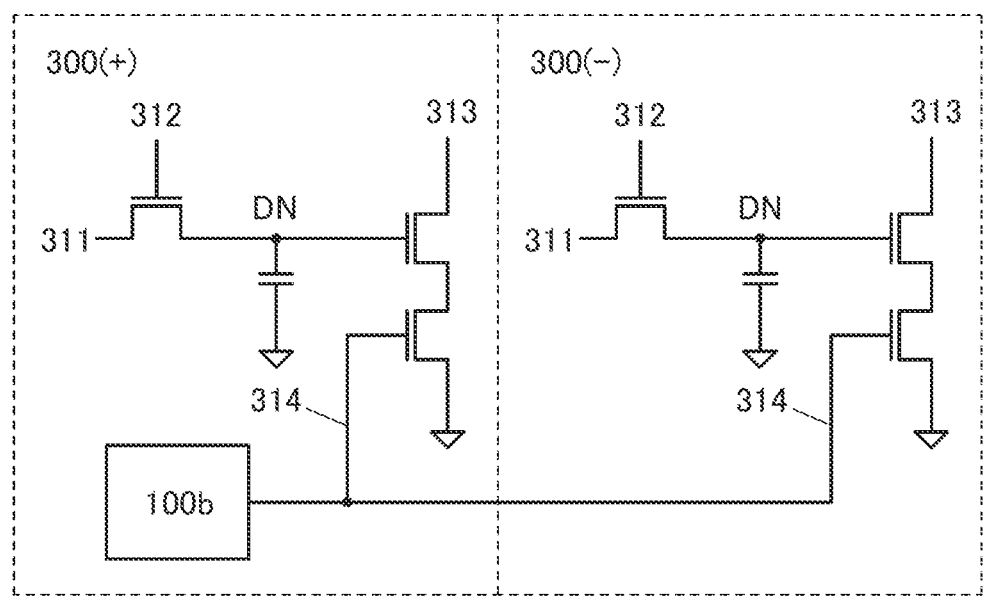

As shown in FIG. 7(B), when one of adjacent second pixel blocks 300 is used for the product-sum operation and the other is used for the product-difference operation, the second pixel blocks 300 may share the pixel 100b. Different weight coefficients can be input to the node DN of each of the second pixel blocks 300; thus, the original image data may be the same.

Although the method for outputting data obtained by performing the product-sum operation or the like on image data from the first pixel block 400 is described above, the image data can be read out from one pixel 100b in the imaging device of one embodiment of the present invention.

As described above, current does not flow through the second pixel block 300 to which 0 is input as the weight coefficient. In the case where two second pixel blocks 300 are provided, the weight coefficient of one second pixel block 300 is set to 1, and the weight coefficient of the other second pixel block 300 is set to 0, whereby image data can be read out from the one second pixel block 300. In addition, by sequentially changing the weight coefficients, the image data can be read out from all the pixels.

Digital data output from the read circuit 500 to the wiring 503 is input to the circuit 405.

The circuit 405 can have a configuration including, for example, a latch circuit, a shift register, and the like. With this configuration, parallel-serial conversion can be performed and data input in parallel can be output as serial data. The destination to which the serial data is output is not limited. For example, the serial data can be output to a neural network, a memory device, a display device, a communication device, or the like.

The circuit 405 may include a neural network. The neural network includes, for example, memory cells arranged in a matrix, and a weight coefficient is held in each memory cell. Data output from the first pixel block 400 can be input to the memory cells and the product-sum operation can be performed.

When the digital data output from the read circuit 500 is taken into a neural network, for example, processing for the following can be performed: an increase in image resolution, a reduction in image noise, face recognition (for security reasons), object recognition (for automated driving), image compression, image compensation (a wide dynamic range), restoration of an image of a lensless image sensor, positioning of a robot, character recognition, fingerprint authentication, eye tracking, reduction of glare and reflection.

This embodiment can be combined with any of the other embodiments as appropriate.

Embodiment 2

In this embodiment, a configuration example of the semiconductor device described in Embodiment 1, which can be used in a neural network, will be described.

Figure 9A:
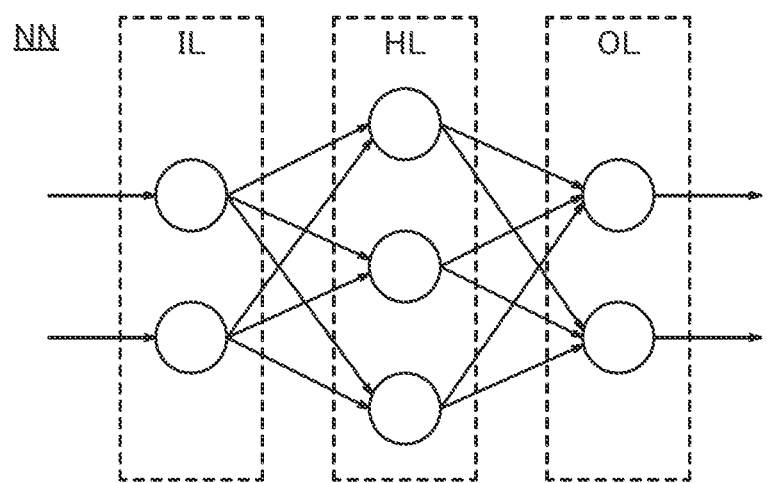
FIGS. 9A and 9B Diagrams illustrating a structure example of a neural network.

As shown in FIG. 9(A), a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as DNN (a deep neural network), and learning using a deep neural network can also be referred to as deep learning.

Input data are input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 9B:
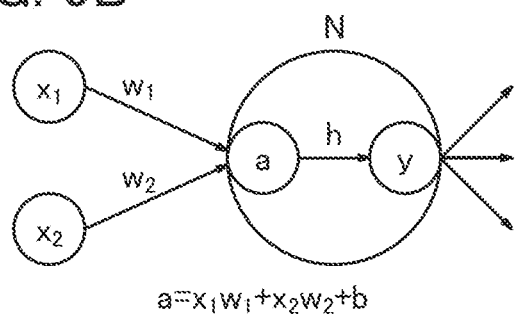

FIG. 9(B) shows an example of an operation with the neurons. Here, a neuron N and two neurons in the previous layer which output signals to the neuron N are shown. An output xi of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal y=h(a) is output from the neuron N.

In this manner, the operation with the neurons includes the operation that sums the products of the outputs and the weights of the neurons in the previous layer, that is, the product-sum operation ($x_1w_1+x_2w_2$ described above). This product-sum operation may be performed using a program on software or using hardware. In the case where the product-sum operation is performed by hardware, a product-sum arithmetic circuit can be used. Either a digital circuit or an analog circuit can be used as this product-sum arithmetic circuit.

An analog circuit is used as the product-sum arithmetic circuit of one embodiment of the present invention. Thus, the circuit scale of the product-sum arithmetic circuit can be reduced, or higher processing speed and lower power consumption can be achieved by reduced frequency of access to a memory.

The product-sum arithmetic circuit may be formed using a Si transistor or an OS transistor. An OS transistor is particularly preferably used as a transistor included in an analog memory of the product-sum arithmetic circuit because of its extremely low off-state current. Note that the product-sum arithmetic circuit may include both a Si transistor and an OS transistor. A configuration example of a semiconductor device serving as the product-sum arithmetic circuit will be described below.

Configuration Example of Semiconductor Device

Figure 10:
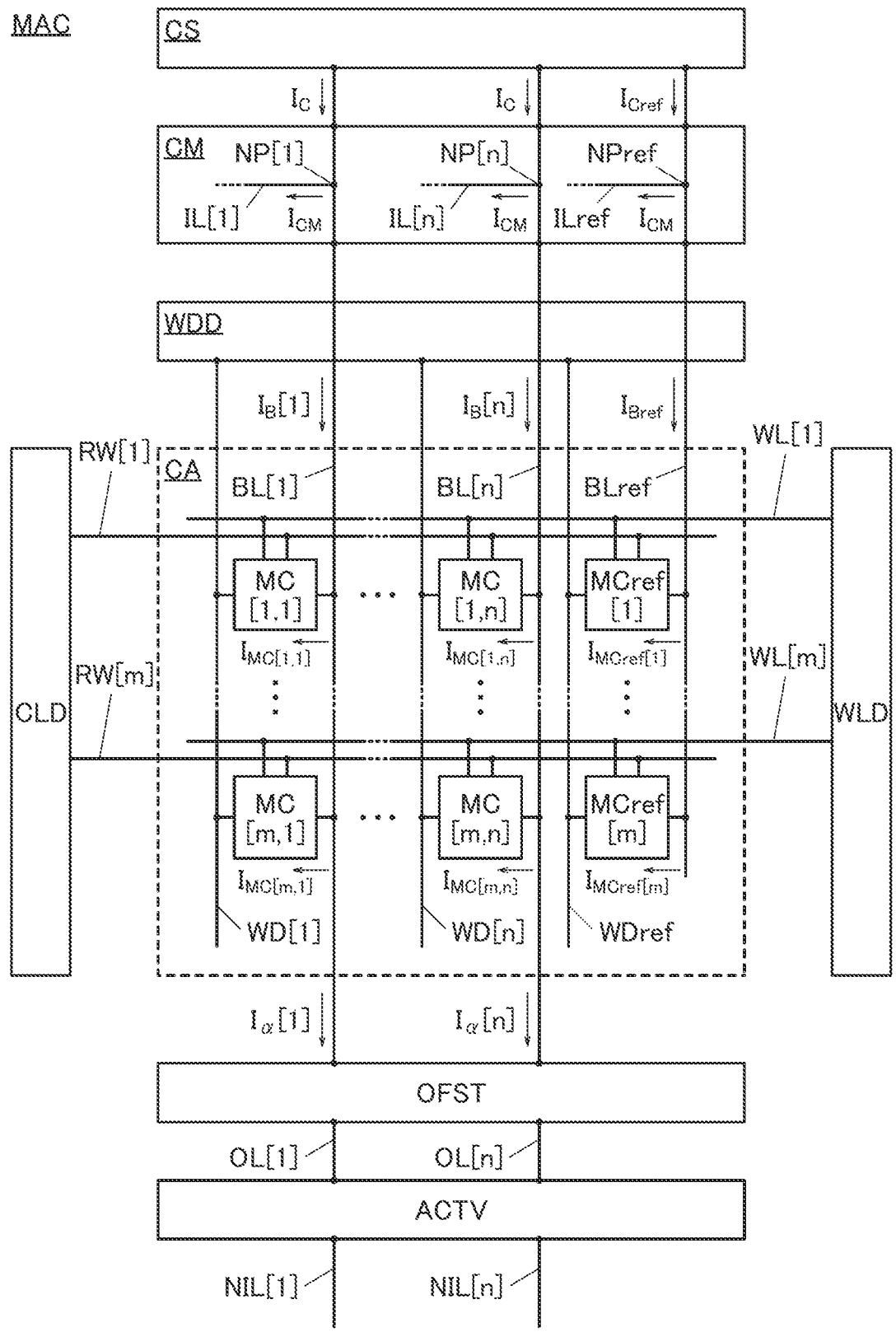
FIG. 10 A diagram illustrating a configuration example of a semiconductor device.

FIG. 10 illustrates a configuration example of a semiconductor device MAC configured to perform an operation of a neural network. The semiconductor device MAC is configured to perform a product-sum operation of first data corresponding to the connection strength (weight) between the neurons and second data corresponding to input data. Note that the first data and the second data can each be analog data or multilevel data (discrete data). The semiconductor device MAC is also configured to convert data obtained by the product-sum operation with the activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. In the configuration example shown in FIG. 10, the cell array CA includes the memory cells MC in m rows and n columns (memory cells MC[1, 1] to MC[m, n]) and the m memory cells MCref (memory cells MCref[1] to MCref[m]) (m and n are integers greater than or equal to 1). The memory cells MC are configured to store the first data. In addition, the memory cells MCref are configured to store reference data used for the product-sum operation. Note that the reference data can be analog data or multilevel data.

The memory cell MC[i, j] is connected to a wiring WL[i], a wiring RW[i], a wiring WD[j], and a wiring BL[j] (i is an integer greater than or equal to 1 and less than or equal to m, and j is an integer greater than or equal to 1 and less than or equal to n). In addition, the memory cell MCref[i] is connected to the wiring WL[i], the wiring RW[i], a wiring WDref, and a wiring BLref. Here, a current flowing between the memory cell MC[i, j] and the wiring BL[j] is denoted by $I_{MC[i, j]}$, and a current flowing between the memory cell MCref[i] and the wiring BLref is denoted by $I_{MCref[i]}$.

Figure 11:
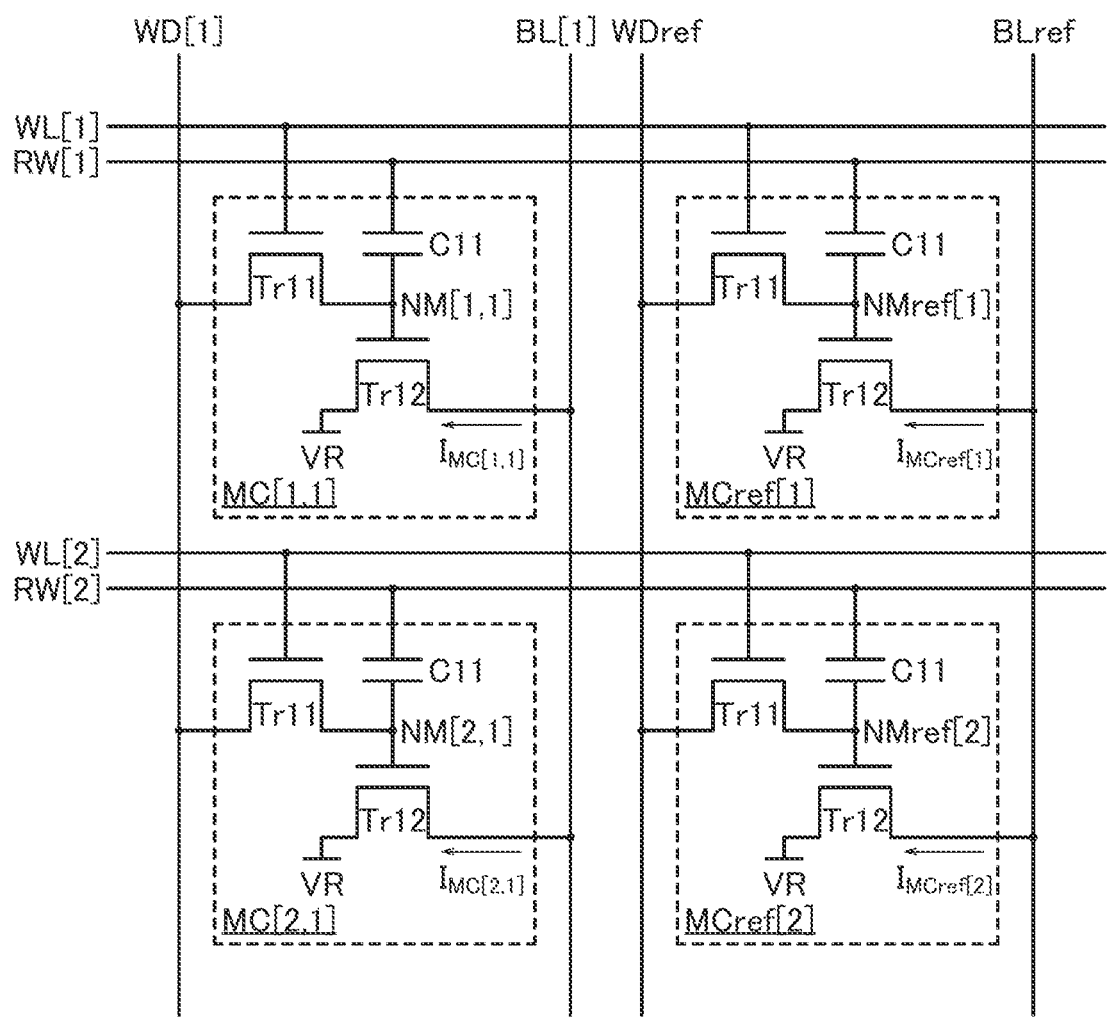
FIG. 11 A diagram illustrating a configuration example of a memory cell.

FIG. 11 shows a specific configuration example of the memory cells MC and the memory cells MCref. Although the memory cells MC[1, 1] and MC[2, 1] and the memory cells MCref[1] and MCref[2] are given as typical examples in FIG. 11, similar configurations can also be used for other memory cells MC and other memory cells MCref. The memory cells MC and the memory cells MCref each include a transistor Tr11, a transistor Tr12, and a capacitor C11. Here, the case where the transistors Tr11 and Tr12 are n-channel transistors will be described.

In the memory cell MC, a gate of the transistor Tr11 is connected to the wiring WL, one of a source and a drain of the transistor Tr11 is connected to a gate of the transistor Tr12 and a first electrode of the capacitor C11, and the other of the source and the drain of the transistor Tr11 is connected to the wiring WD. One of a source and a drain of the transistor Tr12 is connected to the wiring BL, and the other of the source and the drain of the transistor Tr12 is connected to a wiring VR. A second electrode of the capacitor C11 is connected to the wiring RW. The wiring VR is configured to supply a predetermined potential. Here, the case where a low power supply potential (e.g., a ground potential) is supplied from the wiring VR is described as an example.

A node connected to the one of the source and the drain of the transistor Tr11, the gate of the transistor Tr12, and the first electrode of the capacitor C11 is referred to as a node NM. The nodes NM included in the memory cells MC[1, 1] and MC[2, 1] are referred to as nodes NM[1, 1] and NM[2, 1], respectively.

The memory cells MCref have a configuration similar to that of the memory cell MC. However, the memory cells MCref are connected to the wiring WDref instead of the wiring WD and connected to a wiring BLref instead of the wiring BL. Each of a node NMref[1] in the memory cell MCref[1] and a node NMref[2] in the memory cell MCref[2] refers to a node connected to the one of the source and the drain of the transistor Tr11, the gate of the transistor Tr12, and the first electrode of the capacitor C11.

The node NM and the node NMref function as holding nodes of the memory cell MC and the memory cell MCref, respectively. The first data is held in the node NM and the reference data is held in the node NMref. Currents $I_{MC[1, 1]}$ and $I_{MC[2, 1]}$ from the wiring BL[1] flow to the transistors Tr12 of the memory cells MC[1, 1] and MC[2, 1], respectively. Currents $I_{MCref[1]}$ and $I_{MCref[2]}$ from the wiring BLref flow to the transistors Tr12 of the memory cells MCref[1] and MCref[2], respectively.

Since the transistor Tr11 is configured to hold the potential of the node NM or the node NMref, the off-state current of the transistor Tr11 is preferably low. Thus, it is preferable to use an OS transistor, which has extremely low off-state current, as the transistor Tr11. This suppresses a change in the potential of the node NM or the node NMref, so that the operation accuracy can be increased. Furthermore, operations of refreshing the potential of the node NM or the node NMref can be performed less frequently, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be manufactured with the same manufacturing apparatus as the transistor Tr11, and accordingly manufacturing cost can be reduced. Note that the transistor Tr12 may be an n-channel transistor or a p-channel transistor.

The current source circuit CS is connected to the wirings BL[1] to BL[n] and the wiring BLref. The current source circuit CS is configured to supply currents to the wirings BL[1] to BL[n] and the wiring BLref. Note that the value of the current supplied to the wirings BL[1] to BL[n] may be different from the value of the current supplied to the wiring BLref. Here, the current supplied from the current source circuit CS to the wirings BL[1] to BL[n] is denoted by $I_C$, and the current supplied from the current source circuit CS to the wiring BLref is denoted by $I_{C_{ref}}$.

The current mirror circuit CM includes wirings IL[1] to IL[n] and a wiring ILref. The wirings IL[1] to IL[n] are connected to the wirings BL[1] to BL[n], respectively, and the wiring ILref is connected to the wiring BLref. Here, a connection portion between the wirings IL[1] and BL[1] to a connection portion between the wirings IL[n] and BL[n] are referred to as nodes NP[1] to NP[n], respectively. Furthermore, a connection portion between the wiring ILref and the wiring BLref is referred to as a node NPref.

The current mirror circuit CM is configured to supply a current $I_{CM}$ corresponding to the potential of the node NPref to the wiring ILref and supply this current $I_{CM}$ also to the wirings IL[1] to IL[n]. In the example shown in FIG. 10, the current $I_{CM}$ is discharged from the wiring BLref to the wiring ILref, and the current $I_{CM}$ is discharged from the wirings BL[1] to BL[n] to the wirings IL[1] to IL[n]. Furthermore, currents flowing from the current mirror circuit CM to the cell array CA through the wirings BL[1] to BL[n] are denoted by $I_B[1]$ to $I_B[n]$, respectively. Furthermore, a current flowing from the current mirror circuit CM to the cell array CA through the wiring BLref is denoted by $I_{Bref}$.

The circuit WDD is connected to the wirings WD[1] to WD[n] and the wiring WDref. The circuit WDD is configured to supply a potential corresponding to the first data stored in the memory cells MC to the wirings WD[1] to WD[n]. The circuit WDD is also configured to supply a potential corresponding to the reference data stored in the memory cell MCref to the wiring WDref. The circuit WLD is connected to wirings WL[1] to WL[m]. The circuit WLD is configured to supply a signal for selecting the memory cell MC or MCref to which data is to be written, to any of the wirings WL[1] to WL[m]. The circuit CLD is connected to the wirings RW[1] to RW[m]. The circuit CLD is configured to supply a potential corresponding to the second data to the wirings RW[1] to RW[m].

The offset circuit OFST is connected to the wirings BL[1] to BL[n] and wirings OL[1] to OL[n]. The offset circuit OFST is configured to determine the amount of currents flowing from the wirings BL[1] to BL[n] to the offset circuit OFST and/or the amount of change in the currents flowing from the wirings BL[1] to BL[n] to the offset circuit OFST. The offset circuit OFST is also configured to output determination results to the wirings OL[1] to OL[n]. Note that the offset circuit OFST may output currents corresponding to the determination results to the wirings OL, or may convert the currents corresponding to the determination results into voltages to output the voltages to the wirings OL. The currents flowing between the cell array CA and the offset circuit OFST are denoted by $I_\alpha[1]$ to $I_\alpha[n]$.

Figure 12:
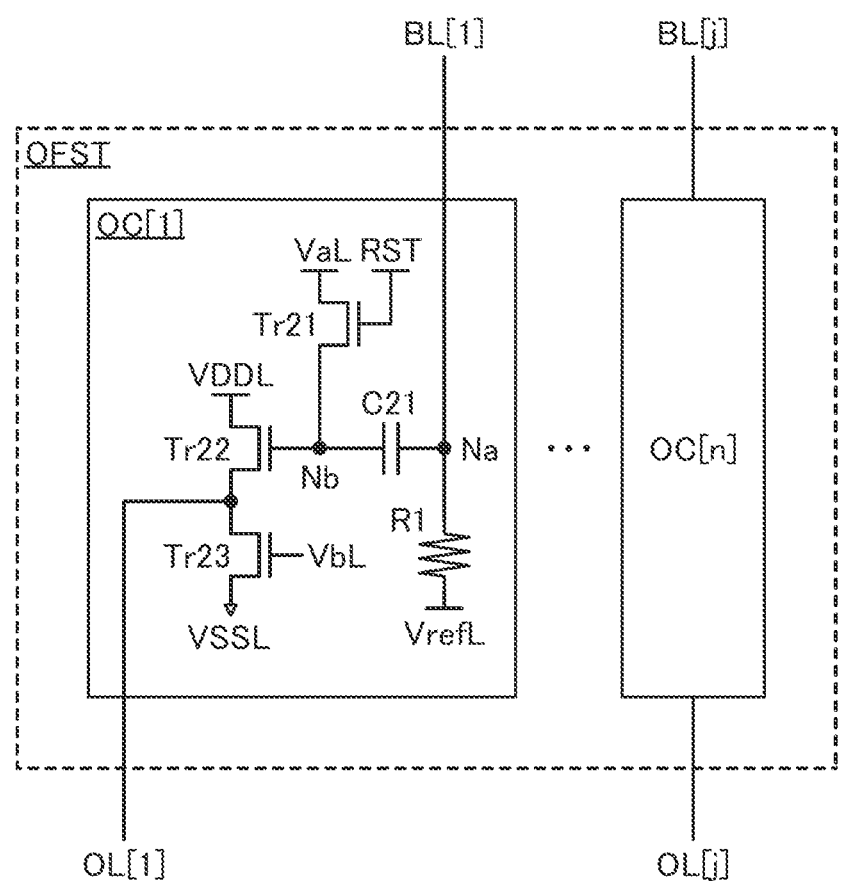
FIG. 12 A diagram illustrating a configuration example of an offset circuit.

FIG. 12 shows a configuration example of the offset circuit OFST. The offset circuit OFST shown in FIG. 12 includes circuits OC[1] to OC[n]. The circuits OC[1] to OC[n] each include a transistor Tr21, a transistor Tr22, a transistor Tr23, a capacitor C21, and a resistor R1. Connection relations of the elements are shown in FIG. 12. Note that a node connected to a first electrode of the capacitor C21 and a first terminal of the resistor R1 is referred to as a node Na. In addition, a node connected to a second electrode of the capacitor C21, one of a source and a drain of the transistor Tr21, and a gate of the transistor Tr22 is referred to as a node Nb.

A wiring VrefL is configured to supply a potential Vref, a wiring VaL is configured to supply a potential Va, and a wiring VbL is configured to supply a potential Vb. Furthermore, a wiring VDDL is configured to supply a potential VDD, and a wiring VSSL is configured to supply a potential VSS. Here, the case where the potential VDD is a high power supply potential and the potential VSS is a low power supply potential is described. A wiring RST is configured to supply a potential for controlling the on/off state of the transistor Tr21. The transistor Tr22, the transistor Tr23, the wiring VDDL, the wiring VSSL, and the wiring VbL form a source follower circuit.

Next, an operation example of the circuits OC[1] to OC[n] will be described. Note that although an operation example of the circuit OC[1] is described here as a typical example, the circuits OC[2] to OC[n] can be operated in a manner similar to that of the circuit OC[1]. First, when a first current flows to the wiring BL[1], the potential of the node Na becomes a potential corresponding to the first current and the resistance value of the resistor R1. At this time, the transistor Tr21 is on, and thus the potential Va is supplied to the node Nb. Then, the transistor Tr21 is turned off.

Next, when a second current flows to the wiring BL[1], the potential of the node Na becomes a potential corresponding to the second current and the resistance value of the resistor R1. At this time, since the transistor Tr21 is off and the node Nb is in a floating state, the potential of the node Nb is changed owing to capacitive coupling, following the change in the potential of the node Na. Here, when the amount of change in the potential of the node Na is $\Delta V_{Na}$ and the capacitive coupling coefficient is 1, the potential of the node Nb is Va+$\Delta V_{Na}$. In addition, when the threshold voltage of the transistor Tr22 is $V_{th}$, a potential of Va+$\Delta V_{Na}$−$V_{th}$ is output from the wiring OL[1]. Here, when Va=$V_{th}$, the potential $\Delta V_{Na}$ can be output from the wiring OL[1].

The potential $\Delta V_{Na}$ is determined by the amount of change from the first current to the second current, the resistor R1 and the potential Vref. Here, since the resistor R1 and the potential Vref are known, the amount of change in the current flowing to the wiring BL can be found from the potential $\Delta V_{Na}$.

A signal corresponding to the amount of current and/or the amount of change in the current that are/is determined by the offset circuit OFST as described above is input to the activation function circuit ACTV through the wirings OL[1] to OL[n].

The activation function circuit ACTV is connected to the wirings OL[1] to OL[n] and wirings NIL[1] to NIL[n]. The activation function circuit ACTV is configured to perform an operation for converting the signal input from the offset circuit OFST in accordance with the predefined activation function. As the activation function, for example, a sigmoid function, a tan h function, a softmax function, a ReLU function, a threshold function, or the like can be used. The signal converted by the activation function circuit ACTV is output as output data to the wirings NIL[1] to NIL[n].

Operation Example of Semiconductor Device

With the above semiconductor device MAC, the product-sum operation of the first data and the second data can be performed. An operation example of the semiconductor device MAC at the time of performing the product-sum operation will be described below.

Figure 13:
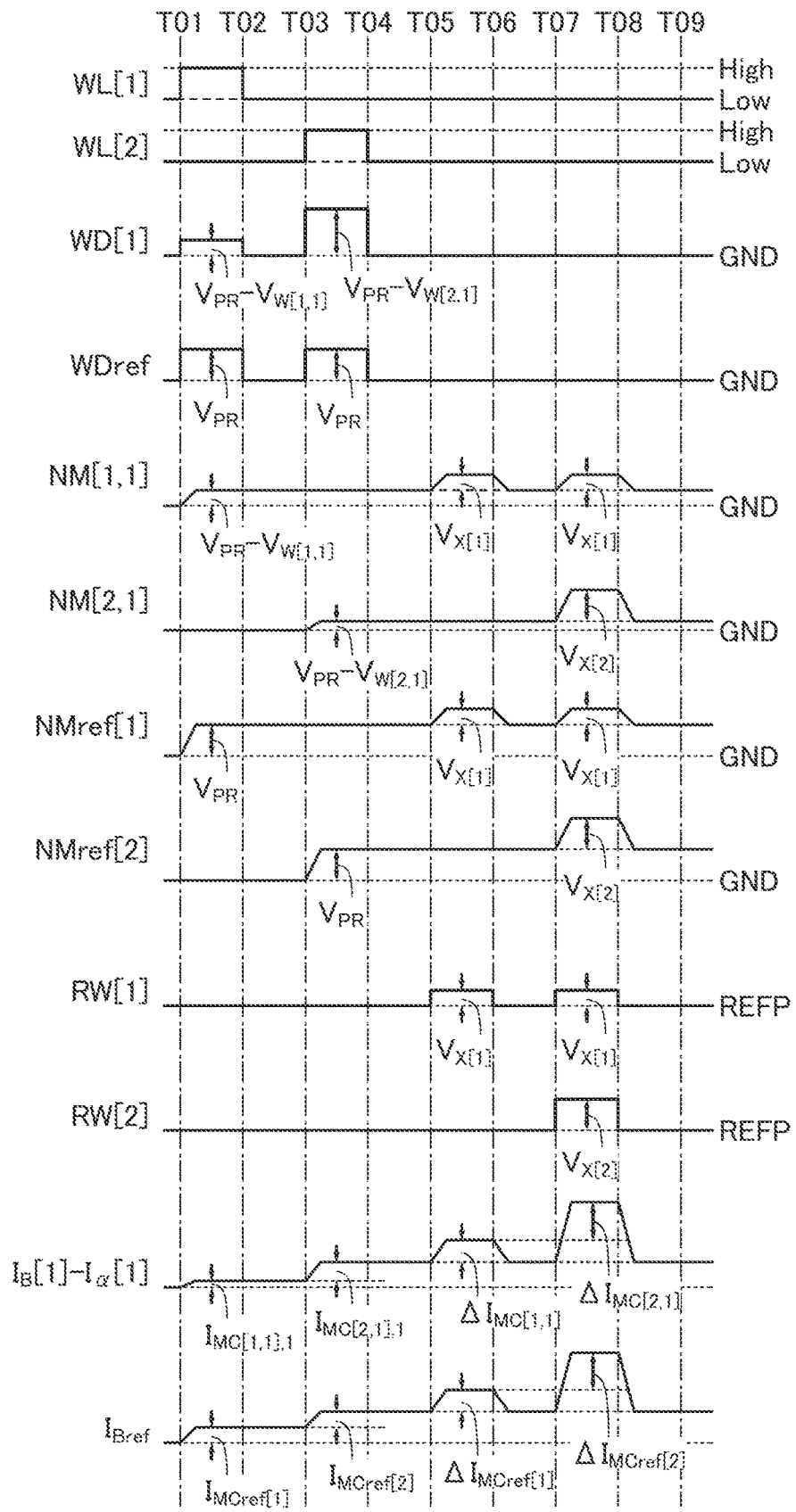
FIG. 13 A timing chart illustrating operation of a semiconductor device.

FIG. 13 shows a timing chart of the operation example of the semiconductor device MAC. FIG. 13 shows changes in the potentials of the wirings WL[1], WL[2], WD[1], and WDref, the nodes NM[1, 1], NM[2, 1], NMref[1], and NMref[2], and the wirings RW[1] and RW[2] in FIG. 11 and changes in the values of the currents $I_B[1]-I_\alpha[1]$ and $I_{Bref}$. The current $I_B[1]-I_\alpha[1]$ corresponds to the sum total of the currents flowing from the wiring BL[1] to the memory cells MC[1, 1] and MC[2, 1].

Although an operation of the memory cells MC[1, 1], MC[2, 1], MCref[1], and MCref[2] shown in FIG. 11 is described as a typical example, the other memory cells MC and MCref can also be operated in a similar manner.

[Storage of First Data]

First, during a period from Time T01 to Time T02, the potential of the wiring WL[1] becomes high, the potential of the wiring WD[1] becomes a potential greater than a ground potential (GND) by $V_{PR}-V_{W[1, 1]}$, and the potential of the wiring WDref becomes a potential greater than the ground potential by $V_{PR}$. The potentials of the wirings RW[1] and RW[2] are reference potentials (REFP). Note that the potential $V_{W[1,1]}$ is the potential corresponding to the first data stored in the memory cell MC[1, 1]. The potential $V_{PR}$ is the potential corresponding to the reference data. Thus, the transistors Tr11 included in the memory cells MC[1, 1] and MCref[1] are turned on, and the potential of the node NM[1, 1] becomes $V_{PR}-V_{W[1,1]}$ and the potential of the node NMref[1] becomes $V_{PR}$.

In this case, a current $I_{MC[1,1],0}$ flowing from the wiring BL[1] to the transistor Tr12 in the memory cell MC[1, 1] can be expressed by a formula shown below. Here, k is a constant determined by the channel length, the channel width, the mobility, the capacitance of a gate insulating film, and the like of the transistor Tr12. In addition, $V_{th}$ is the threshold voltage of the transistor Tr12.

$$I_{MC[1,1],0}=k(V_{PR}-V_{W[1,1]}-V_{th})^2 \quad (E1)$$

A current $I_{MCref[1],0}$ flowing from the wiring BLref to the transistor Tr12 in the memory cell MCref[1] can be expressed by a formula shown below.

$$I_{MCref[1],0}=k(V_{PR}-V_{th})^2 \quad (E2)$$

Next, during a period from Time T02 to Time T03, the potential of the wiring WL [1] becomes low. Consequently, the transistors Tr11 included in the memory cells MC[1, 1] and MCref[1] are turned off, and the potentials of the nodes NM[1, 1] and NMref[1] are held.

As described above, an OS transistor is preferably used as the transistor Tr11. This can suppress the leakage current of the transistor Tr11, so that the potentials of the nodes NM[1, 1] and NMref[1] can be accurately held.

Next, during a period from Time T03 to Time T04, the potential of the wiring WL[2] becomes high, the potential of the wiring WD[1] becomes a potential greater than the ground potential by $V_{PR}-V_{W[2,1]}$, and the potential of the wiring WDref becomes a potential greater than the ground potential by $V_{PR}$. Note that the potential $V_{W[2,1]}$ is a potential corresponding to the first data stored in the memory cell MC[2, 1]. Thus, the transistors Tr11 included in the memory cells MC[2, 1] and MCref[2] are turned on, and the potential of the node NM[1, 1] becomes $V_{PR}-V_{W[2,1]}$ and the potential of the node NMref[1] becomes $V_{PR}$.

Here, a current $I_{MC[2,1],0}$ flowing from the wiring BL[1] to the transistor Tr12 in the memory cell MC[2, 1] can be expressed by a formula shown below.

$$I_{MC[2,1],0}=k(V_{PR}-V_{W[2,1]}-V_{th})^2 \quad (E3)$$

Furthermore, a current $I_{MCref[2],0}$ flowing from the wiring BLref to the transistor Tr12 in the memory cell MCref[2] can be expressed by a formula shown below.

$$I_{MCref[2],0}=k(V_{PR}-V_{th})^2 \quad (E4)$$

Next, during a period from Time T04 to Time T05, the potential of the wiring WL[2] becomes low. Consequently, the transistors Tr11 included in the memory cells MC[2, 1] and MCref[2] are turned off, and the potentials of the nodes NM[2, 1] and NMref[2] are held.

Through the above operation, the first data is stored in the memory cells MC[1, 1] and MC[2, 1], and the reference data is stored in the memory cells MCref[1] and MCref[2].

Here, currents flowing to the wirings BL[1] and BLref during the period from Time T04 to Time T05 are considered. The current is supplied from the current source circuit CS to the wiring BLref. The current flowing through the wiring BLref is discharged to the current mirror circuit CM and the memory cells MCref[1] and MCref[2]. A formula shown below holds, where $I_{Cref}$ is the current supplied from the current source circuit CS to the wiring BLref and $I_{CM,0}$ is the current discharged from the wiring BLref to the current mirror circuit CM.

$$I_{Cref}-I_{CM,0}=I_{MCref[1],0}+I_{MCref[2],0} \quad (E5)$$

The current from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{C,0}$ is the current supplied from the current source circuit CS to the wiring BL[1] and $I_{\alpha,0}$ is the current flowing from the wiring BL[1] to the offset circuit OFST.

$$I_C-I_{CM,0}=I_{MC[1,1],0}+I_{MC[2,1],0}+I_{\alpha,0} \quad (E6)$$

[Product-Sum Operation of First Data and Second Data]

Next, during a period from Time T05 to Time T06, the potential of the wiring RW[1] becomes a potential greater than the reference potential by $V_{X[1]}$. At this time, the potential $V_{X[1]}$ is supplied to the capacitors C11 in the memory cells MC[1, 1] and MCref[1], so that the potentials of the gates of the transistors Tr12 increase owing to capacitive coupling. Note that the potential $V_{X[1]}$ is the potential corresponding to the second data supplied to the memory cells MC[1, 1] and MCref[1].

The amount of change in the potential of the gate of the transistor Tr12 corresponds to the value obtained by multiplying the amount of change in the potential of the wiring RW by a capacitive coupling coefficient determined by the memory cell configuration. The capacitive coupling coefficient is calculated on the basis of the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is set to 1. In practice, the potential $V_x$ can be determined in consideration of the capacitive coupling coefficient.

When the potential $V_{X[1]}$ is supplied to the capacitors C11 in the memory cells MC[1] and MCref[1], the potentials of the nodes NM[1] and NMref[1] each increase by $V_{X[1]}$.

Here, a current $I_{MC[1,1],1}$ flowing from the wiring BL[1] to the transistor Tr12 in the memory cell MC[1, 1] during the period from Time T05 to Time T06 can be expressed by a formula shown below.

$$I_{MC[1,1],1}=k(V_{PR}-V_{W[1,1]}+V_{X[1]}-V_{th})^2 \quad (E7)$$

Thus, when the potential $V_{X[1]}$ is supplied to the wiring RW[1], the current flowing from the wiring BL[1] to the transistor Tr12 in the memory cell MC[1, 1] increases $\Delta I_{MC[1,1]}=I_{MC[1,1],1}-I_{MC[1,1],0}$.

Here, a current $I_{MCref[1],1}$ flowing from the wiring BLref to the transistor Tr12 in the memory cell MCref[1] during the period from Time T05 to Time T06 can be expressed by a formula shown below.

$$I_{MCref[1],1}=k(V_{PR}+V_{X[1]}-V_{th})^2 \quad (E8)$$

Thus, when the potential $V_{X[1]}$ is supplied to the wiring RW[1], the current flowing from the wiring BLref to the transistor Tr12 in the memory cell MCref[1] increases by $\Delta I_{MCref[1]}=I_{MCref[1],1}-I_{MCref[1],0}$.

Furthermore, currents flowing to the wirings BL[1] and BLref are considered. A current $I_{Cref}$ is supplied from the current source circuit CS to the wiring BLref. The current flowing through the wiring BLref is discharged to the current mirror circuit CM and the memory cells MCref[1] and MCref[2]. A formula shown below holds, where $I_{CM,\,1}$ is the current discharged from the wiring BLref to the current mirror circuit CM.

$$I_{Cref} - I_{CM,1} = I_{MCref[1],1} + I_{MCref[2],0} \quad (E9)$$

The current $I_C$ is supplied from the current source circuit CS to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{\alpha,\,1}$ is the current flowing from the wiring BL[1] to the offset circuit OFST.

$$I_C - I_{CM,1} = I_{MC[1,1],1} + I_{MC[2,1],1} + I_{\alpha,1} \quad (E10)$$

In addition, from Formulae (E1) to (E10), a difference between the current $I_{\alpha,\,0}$ and the current $I_{\alpha,\,1}$ (differential current $\Delta I_\alpha$) can be expressed by a formula shown below.

$$\Delta I_\alpha = I_{\alpha,0} - I_{\alpha,1} = 2kV_{W[1,1]}V_{X[1]} \quad (E11)$$

Thus, the differential current $\Delta I_\alpha$ is a value corresponding to the product of the potentials $V_{W[1,\,1]}$ and $V_{X[1]}$.

After that, during a period from Time T06 to Time T07, the potential of the wiring RW[1] becomes the ground potential, and the potentials of the nodes NM[1, 1] and NMref[1] become the same as the potentials thereof during the period from Time T04 to Time T05.

Next, during a period from Time T07 to Time T08, the potential of the wiring RW[1] becomes the potential greater than the reference potential by $V_{X[1]}$, and the potential of the wiring RW[2] becomes a potential greater than the reference potential by $V_{X[2]}$. Accordingly, the potential $V_{X[1]}$ is supplied to the capacitors C11 in the memory cells MC[1, 1] and MCref[1], and the potentials of the nodes NM[1, 1] and NMref[1] each increase by $V_{X[1]}$ owing to capacitive coupling. Furthermore, the potential $V_{X[2]}$ is supplied to the capacitors C11 in the memory cells MC[2, 1] and MCref[2], and the potentials of the nodes NM[2, 1] and NMref[2] each increase by $V_{X[2]}$ owing to capacitive coupling.

Here, the current $I_{MC[2,\,1],\,1}$ flowing from the wiring BL[1] to the transistor Tr12 in the memory cell MC[2, 1] during the period from Time T07 to Time T08 can be expressed by a formula shown below.

$$I_{MC[2,1],1} = k(V_{PR} - V_{W[2,1]} + V_{X[2]} - V_{th})^2 \quad (E12)$$

Thus, when the potential $V_{X[2]}$ is supplied to the wiring RW[2], the current flowing from the wiring BL[1] to the transistor Tr12 in the memory cell MC[2, 1] increases by $\Delta I_{MC[2,\,1]} = I_{MC[2,\,1],\,1} - I_{MC[2,\,1],\,0}$.

Here, a current $I_{MCref[2],\,1}$ flowing from the wiring BLref to the transistor Tr12 in the memory cell MCref[2] during the period from Time T05 to Time T06 can be expressed by a formula shown below.

$$I_{MCref[2],1} = k(V_{PR} + V_{X[2]} - V_{th})^2 \quad (E13)$$

Thus, when the potential $V_{X[2]}$ is supplied to the wiring RW[2], the current flowing from the wiring BLref to the transistor Tr12 in the memory cell MCref[2] increases by $\Delta I_{MCref[2]} = I_{MCref[2],\,1} - I_{MCref[2],\,0}$.

Furthermore, currents flowing to the wirings BL[1] and BLref are considered. The current $I_{Cref}$ is supplied from the current source circuit CS to the wiring BLref. The current flowing through the wiring BLref is discharged to the current mirror circuit CM and the memory cells MCref[1] and MCref[2]. A formula shown below holds, where $I_{CM,\,2}$ is the current discharged from the wiring BLref to the current mirror circuit CM.

$$I_{Cref} - I_{CM,2} = I_{MCref[1],1} + I_{MCref[2],1} \quad (E14)$$

The current $I_C$ is supplied from the current source circuit CS to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{\alpha,\,2}$ is the current flowing from the wiring BL[1] to the offset circuit OFST.

$$I_C - I_{CM,2} = I_{MC[1,1],1} + I_{MC[2,1],1} + I_{\alpha,2} \quad (E15)$$

In addition, from Formulae (E1) to (E8) and (E12) to (E15), a difference between the current $I_{\alpha,\,0}$ and the current $I_{\alpha,\,2}$ (differential current $\Delta I_\alpha$) can be expressed by a formula shown below.

$$\Delta I_\alpha = I_{\alpha,0} - I_{\alpha,2} = 2k(V_{W[1,1]}V_{X[1]} + V_{W[2,1]}V_{X[2]}) \quad (E16)$$

Thus, the differential current $\Delta I_\alpha$ is a value corresponding to the sum of the product of the potentials $V_{W[1,\,1]}$ and $V_{X[1]}$ and the product of the potentials $V_{W[2,\,1]}$ and $V_{X[2]}$.

After that, during a period from Time T08 to Time T09, the potentials of the wirings RW[1] and RW[2] become the ground potential, and the potentials of the nodes NM[1, 1], NM[2, 1], NMref[1], and NMref[2] become the same as the potentials thereof during the period from Time T04 to Time T05.

As represented by Formulae (E9) and (E16), the differential current $\Delta I_\alpha$ input to the offset circuit OFST is a value corresponding to the sum of the product of the potential $V_X$ corresponding to the first data (weight) and the potential $V_W$ corresponding to the second data (input data). Thus, measurement of the differential current $\Delta I_\alpha$ with the offset circuit OFST gives the result of the product-sum operation of the first data and the second data.

Note that although the memory cells MC[1, 1], MC[2, 1], MCref[1], and MCref[2] are focused on in the above description, the number of the memory cells MC and MCref can be any number. In the case where the number m of rows of the memory cells MC and MCref is a given number, the differential current $\Delta I_\alpha$ can be expressed by a formula shown below.

$$\Delta I_\alpha = 2k\Sigma_i V_{W[i,1]}V_{X[i]} \quad (E17)$$

When the number n of columns of the memory cells MC and MCref is increased, the number of product-sum operations executed in parallel can be increased.

The product-sum operation of the first data and the second data can be performed using the semiconductor device MAC as described above. Note that the use of the configuration of the memory cells MC and MCref in FIG. 11 allows the product-sum arithmetic circuit to be formed using fewer transistors. Accordingly, the circuit scale of the semiconductor device MAC can be reduced.

In the case where the semiconductor device MAC is used for the operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL in FIG. 9(A) is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the configuration of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), and the like.

The product-sum operation of the neural network can be performed using the semiconductor device MAC as described above. Furthermore, when the memory cells MC and MCref shown in FIG. 11 are used for the cell array CA, it is possible to provide an integrated circuit IC with improved operation accuracy, lower power consumption, or a reduced circuit scale.

This embodiment can be combined with any of the other embodiments as appropriate.

Embodiment 3

In this embodiment, a configuration example and the like of an imaging device of one embodiment of the present invention will be described.

Figure 14A:
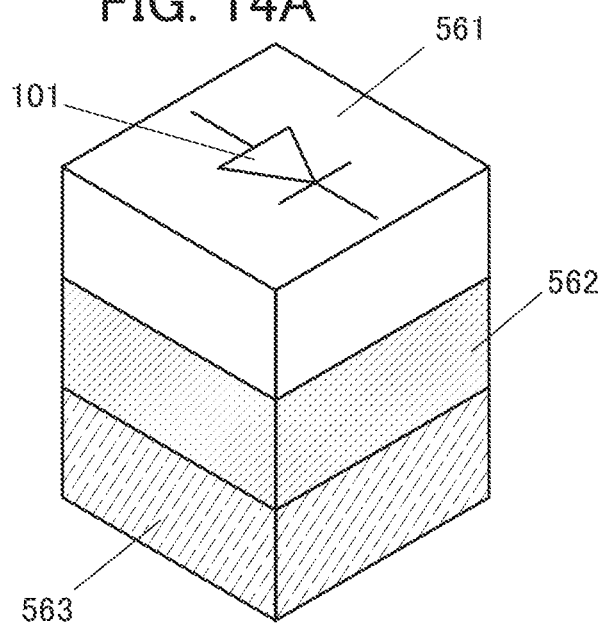
FIGS. 14A-14C Diagrams illustrating structures of a pixel in an imaging device.

FIG. 14(A) shows an example of a structure of a pixel included in an imaging device. A pixel shown in FIG. 14(A) has a stacked-layer structure of the layer 561, the layer 562, and the layer 563.

The layer 561 includes the photoelectric conversion element 101. The photoelectric conversion element 101 can have a stacked-layer structure of a layer 565a, a layer 565b, and a layer 565c as shown in FIG. 14(B).

Figure 14B:
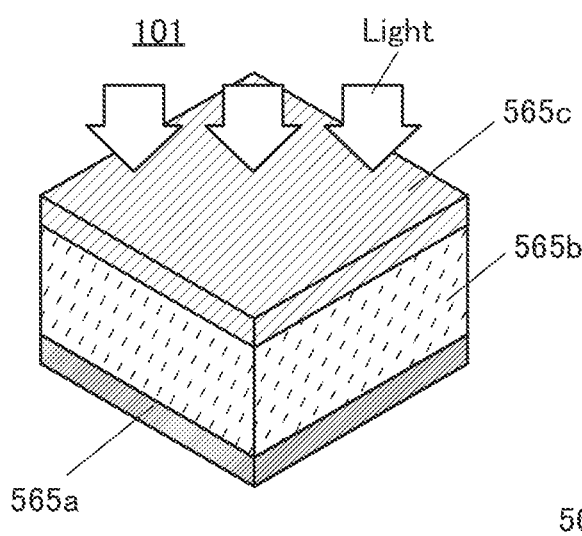

The photoelectric conversion element 101 shown in FIG. 14(B) is a pn-junction photodiode; for example, a $p^+$-type semiconductor can be used for the layer 565a, an n-type semiconductor can be used for the layer 565b, and an $n^+$-type semiconductor can be used for the layer 565c. Alternatively, an $n^+$-type semiconductor may be used for the layer 565a, a p-type semiconductor may be used for the layer 565b, and a $p^+$-type semiconductor may be used for the layer 565c. Alternatively, a pin-junction photodiode in which the layer 565b is an i-type semiconductor may be used.

The pn-junction photodiode or the pin-junction photodiode can be formed using single crystal silicon. The pin-junction photodiode can also be formed using a thin film of amorphous silicon, microcrystalline silicon, polycrystalline silicon, or the like.

Figure 14C:
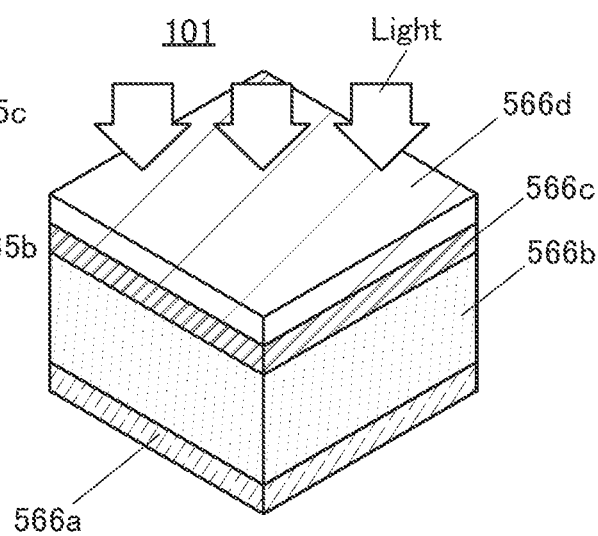

The photoelectric conversion element 101 included in the layer 561 may be a stacked layer of a layer 566a, a layer 566b, a layer 566c, and a layer 566d, as shown in FIG. 14(C). The photoelectric conversion element 101 shown in FIG. 14(C) is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

A conductive layer having a high light-transmitting property with respect to visible light is preferably used for the layer 566d. For example, an indium oxide, a tin oxide, a zinc oxide, an indium tin oxide, a gallium zinc oxide, an indium gallium zinc oxide, graphene, or the like can be used. Note that a structure in which the layer 566d is omitted can be also employed.

A structure of a pn-junction photodiode containing a selenium-based material in a photoelectric conversion layer can be used for the layers 566b and 566c of the photoelectric conversion portion, for example. A selenium-based material, which is a p-type semiconductor, is preferably used for the layer 566b, and a gallium oxide or the like, which is an n-type semiconductor, is preferably used for the layer 566c.

A photoelectric conversion element containing a selenium-based material has characteristics of high external quantum efficiency with respect to visible light. In the photoelectric conversion element, electrons are greatly amplified with respect to the amount of incident light by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, a zinc oxide, a gallium oxide, an indium oxide, a tin oxide, or a mixed oxide thereof can be used. In addition, these materials have a function of a hole-injection blocking layer, so that a dark current can be decreased.

The layer 562 can include an OS transistor. Specifically, the transistor 102 of the pixel 100a, the transistor 301 of the second pixel block 300, and the like can be provided in the layer 563. In addition, some transistors included in the circuits 201 to 203, the first pixel block 400, and the circuits 401 to 405 may be provided in the layer 562.

With this structure, components in the pixel circuit and peripheral circuits can be dispersed in a plurality of layers, and can be provided such that the components overlap with each other or the component overlap with the peripheral circuit, resulting in a reduction in the area of the imaging device.

As a semiconductor material used for the OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAC-OS described later or the like can be used.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, it is preferable that the atomic ratio of metal elements of a sputtering target used for forming a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratios of metal elements of the sputtering targets in a range of ±40%.

An oxide semiconductor with low carrier density is used as the semiconductor layer. For example, for the semiconductor layer, an oxide semiconductor whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

However, the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon which is one of elements belonging to Group 14 is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/$cm^3$, preferably lower than or equal to $2\times10^{17}$ atoms/$cm^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/$cm^3$, preferably lower than or equal to $2\times10^{16}$ atoms/$cm^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to be normally on. Hence, the nitrogen concentration (the concentration obtained by secondary ion mass spectrometry) in the semiconductor layer is preferably set to lower than or equal to $5\times10^{18}$ atoms/$cm^3$.

The semiconductor layer may have a non-single-crystal structure, for example. Examples of the non-single-crystal structure include CAAC-OS (C-Axis Aligned Crystalline Oxide Semiconductor, or C-Axis Aligned and A-B-plane Anchored Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide semiconductor film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc are contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In-Ga-Zn oxide (an In-Ga-Zn oxide in the CAC-OS may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring-like high-luminance region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

In contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element using the CAC-OS has high reliability. Thus, the CAC-OS is suitably used as a constituent material of a variety of semiconductor devices.

For the layer 563, for example, a silicon substrate can be used. The silicon substrate includes a Si transistor or the like. With the use of the Si transistor, a pixel circuit, a circuit for driving the pixel circuit, a circuit for reading an image signal, an image processing circuit, or the like can be provided. Specifically, a plurality of transistors included in the pixel 100a, the circuits 201 to 203, the first pixel block 400, and the circuits 401 to 405 can be provided in the layer 563.

Figure 15A:
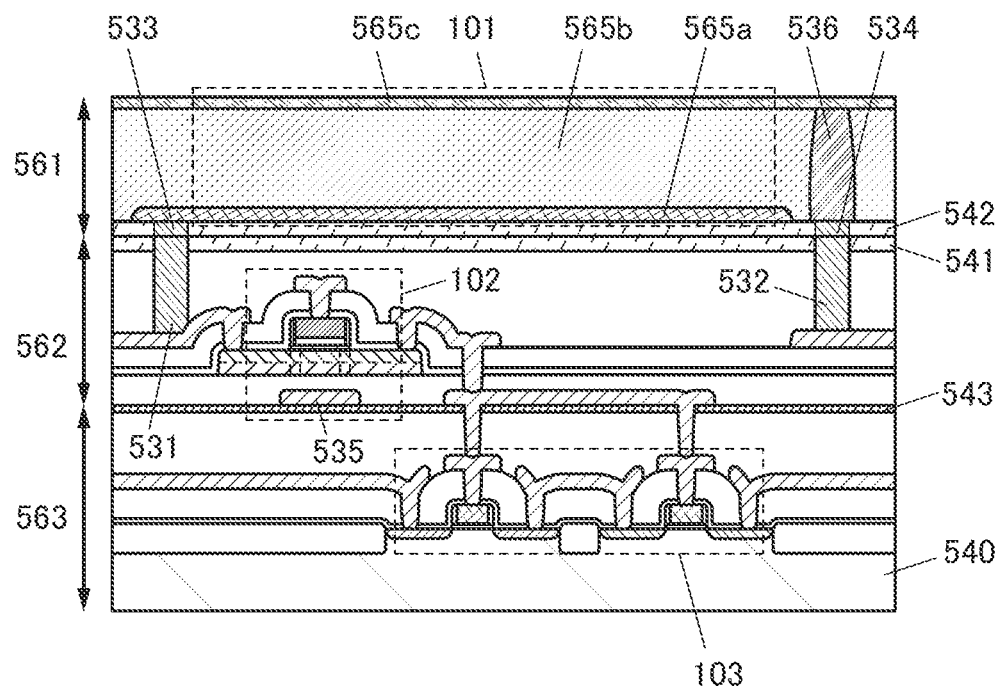
FIGS. 15A and 15B Diagrams illustrating structures of a pixel in an imaging device.

FIG. 15(A) is a view illustrating an example of a cross section of the pixel shown in FIG. 14(A). The layer 561 includes a pn-junction photodiode which uses silicon in its photoelectric conversion layer, as the photoelectric conversion element 101. The layer 562 includes an OS transistor and FIG. 15(A) illustrates the transistor 102 of the pixel 100a, as an example. The layer 563 includes a Si transistor, and FIG. 15(A) illustrates an n-channel transistor and a p-channel transistor included in the inverter circuit 103 in the pixel 100a, as an example.

In the photoelectric conversion element 101, the layer 565a can be a $p^+$-type region, the layer 565b can be an n-type region, and the layer 565c can be an $n^+$-type region. The layer 565b is provided with a region 536 for connecting a power supply line to the layer 565c. For example, the region 536 can be a $p^|$-type region.

Figure 16A:
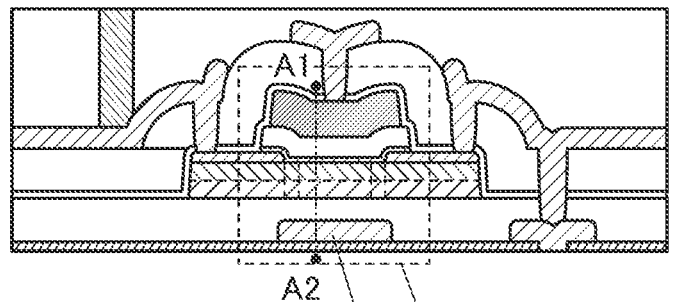
FIGS. 16A-16E Diagrams illustrating structures of a pixel in an imaging device.

Although the OS transistors having a self-aligned structure are shown in FIG. 15(A), top-gate transistors having a non-self-aligned structure may be employed as shown in FIG. 16(A).

Figure 16B:
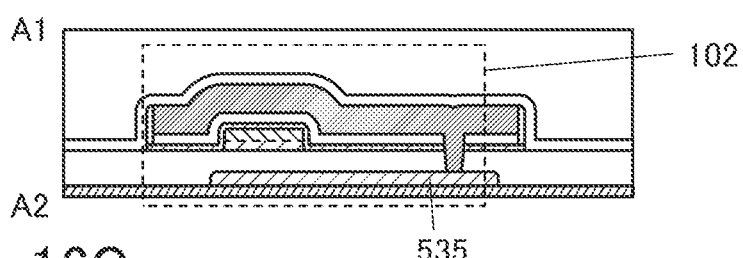

Although a structure in which the transistor 102 includes a back gate 535 is shown, a structure without a back gate may be employed. As shown in FIG. 16(B), the back gate 535 might be electrically connected to a front gate of the transistor, which is provided to face the back gate. Alternatively, different fixed potentials may be supplied to the back gate 535 and the front gate.

Figure 16C:
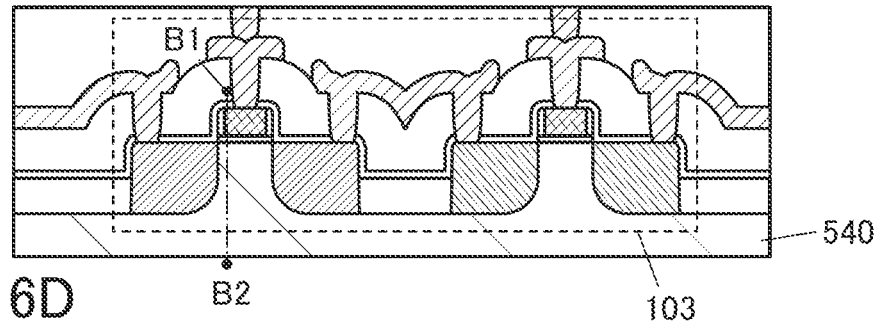
Figure 16D:
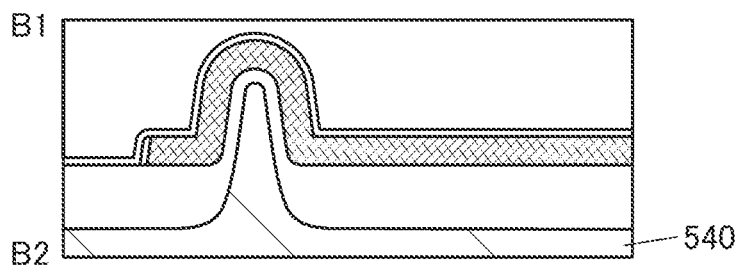

Although the Si transistor shown in FIG. 15(A) is of a planar type including a channel formation region in the silicon substrate 540, the Si transistor may include a fin semiconductor layer in the silicon substrate 540 as shown in FIGS. 16(C) and 16(D). FIG. 16(C) corresponds to a cross section in the channel length direction, and FIG. 16(D) corresponds to a cross section in the channel width direction.

Figure 16E:
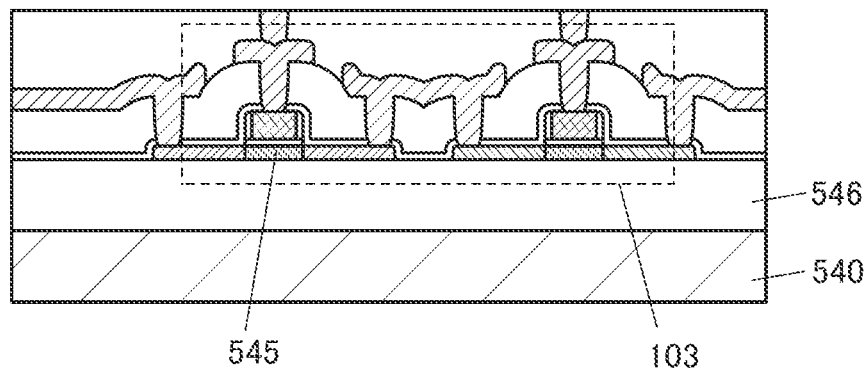

Alternatively, as shown in FIG. 16(E), a transistor including a semiconductor layer 545 of a silicon thin film may be used. The semiconductor layer 545 can be single crystal silicon (SOI (Silicon on Insulator) formed on an insulating layer 546 on the silicon substrate 540, for example.

An insulating layer 543 that has a function of inhibiting diffusion of hydrogen is provided between a region where an OS transistor is formed and a region where a Si transistor is formed. Hydrogen in the insulating layer provided in the vicinity of the channel formation region of the Si transistor included in the inverter circuit 103 terminates a dangling bond of silicon. Meanwhile, hydrogen in the insulating layer provided in the vicinity of the channel formation region of the OS transistor (the transistor 102) is a factor of generating a carrier in the oxide semiconductor layer.

Hydrogen is confined in one layer using the insulating layer 543, whereby the reliability of the Si transistor can be improved. Furthermore, diffusion of hydrogen from the one layer to the other layer is inhibited, so that the reliability of the OS transistor can also be improved.

For the insulating layer 543, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used, for example.

Here, FIG. 15(A) shows an example of a structure in which electrical connection between components included in the layer 561 and components included in the layer 562 is obtained by a bonding technique.

An insulating layer 542, a conductive layer 533, and a conductive layer 534 are provided in the layer 561. The conductive layer 533 and the conductive layer 534 each include a region embedded in the insulating layer 542. The conductive layer 533 is electrically connected to the layer 565*a*. The conductive layer 534 is electrically connected to the region 536. Furthermore, the surfaces of the insulating layer 542, the conductive layer 533, and the conductive layer 534 are planarized to have the same level.

An insulating layer 541, a conductive layer 531, and a conductive layer 532 are provided in the layer 562. The conductive layer 531 and the conductive layer 532 each include a region embedded in the insulating layer 541. The conductive layer 532 is electrically connected to a power supply line. The conductive layer 531 is electrically connected to the source or the drain of the transistor 102. Furthermore, the surfaces of the insulating layer 541, the conductive layer 531, and the conductive layer 532 are planarized to have the same level.

Here, a main component of the conductive layer 531 and a main component of the conductive layer 533 are preferably the same metal element. A main component of the conductive layer 532 and a main component of the conductive layer 534 are preferably the same metal element. Furthermore, it is preferable that the insulating layer 541 and the insulating layer 542 be formed of the same component.

For example, for the conductive layers 531, 532, 533, and 534, Cu, Al, Sn, Zn, W, Ag, Pt, Au, or the like can be used. Preferably, Cu, Al, W, or Au is used for easy bonding. In addition, for the insulating layers 541 and 542, silicon oxide, silicon oxynitride, silicon nitride oxide, silicon nitride, titanium nitride, or the like can be used.

That is, the same metal material selected from the above-described metal elements is preferably used for the combination of the conductive layer 531 and the conductive layer 533, and the same metal material selected from the above-described metal elements is preferably used for the combination of the conductive layer 532 and the conductive layer 534. Furthermore, the same insulating material selected from the above-described insulating materials is preferably used for the insulating layer 541 and the insulating layer 542. With this structure, bonding where a boundary between the layer 561 and the layer 562 is a bonding position can be performed.

This bonding enables an electric connection between the conductive layer 531 and the conductive layer 533 and between the conductive layer 532 and the conductive layer 534. In addition, connection between the insulating layer 541 and the insulating layer 542 with mechanical strength can be obtained.

For bonding the metal layers to each other, a surface activated bonding method in which an oxide film, a layer adsorbing impurities, and the like on the surface are removed by sputtering or the like and the cleaned and activated surfaces are brought into contact to be bonded to each other can be used. Alternatively, a diffusion bonding method in which the surfaces of the metal layers are bonded to each other by using temperature and pressure together can be used, for example. Both methods cause bonding at an atomic level, and therefore not only electrically but also mechanically excellent bonding can be obtained.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 561 and the layer 562 are bonded to each other, the insulating layers and the metal layers coexist on their bonding surfaces; therefore, the surface activated bonding method and the hydrophilic bonding method are performed in combination, for example.

For example, the following method can be used: the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

Figure 15B:
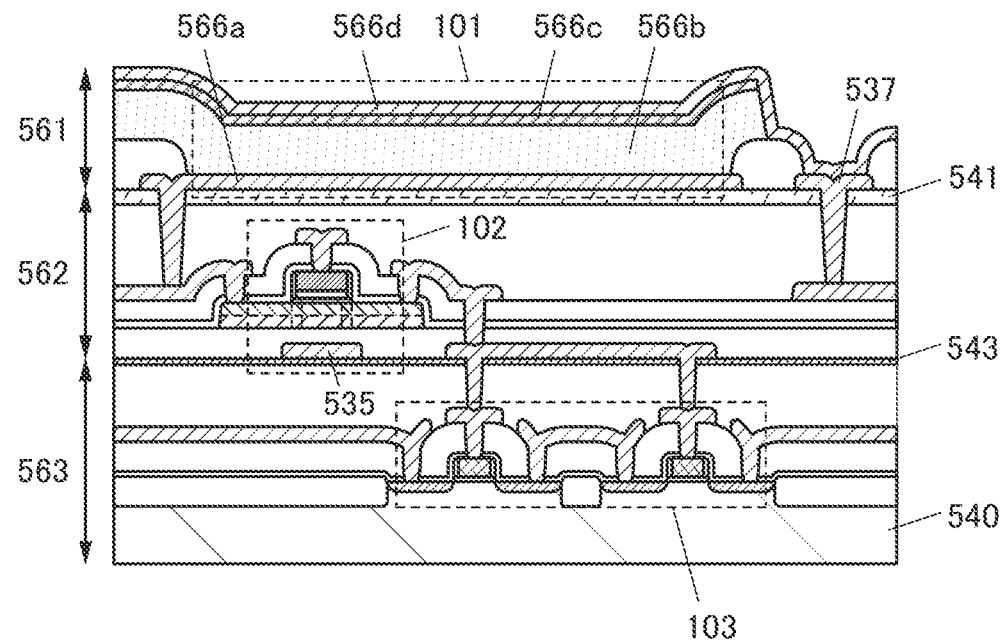

FIG. 15(B) is a cross-sectional view in the case where a pn-junction photodiode in which a selenium-based material is used for a photoelectric conversion layer is used for the layer 561 of the pixel shown in FIG. 14(A). A layer 566*a* is included as one electrode, layers 566*b* and 566*c* are included as a photoelectric conversion layer, and a layer 566*d* is included as the other electrode.

In that case, the layer 561 can be directly formed on the layer 562. The layer 566*a* is electrically connected to the source or the drain of the transistor 102. The layer 566*d* is electrically connected to the power supply line through the conductive layer 537.

Figure 17A:
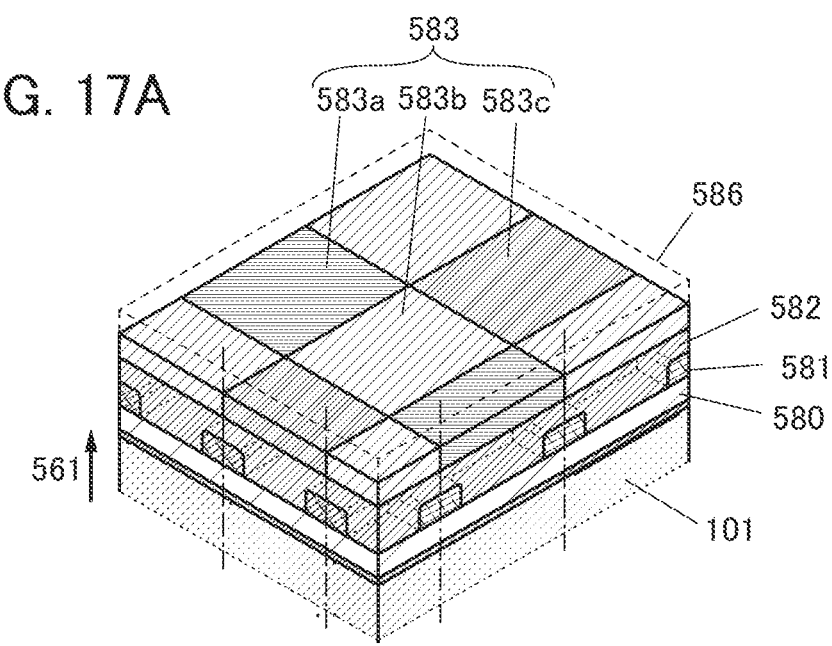
FIGS. 17A-17C Diagrams illustrating structures of a pixel in an imaging device.

FIG. 17(A) is a perspective view showing an example in which a color filter and the like are added to a pixel of the imaging device of one embodiment of the present invention. The perspective view also shows cross sections of a plurality of pixels. An insulating layer 580 is formed over the layer 561 where the photoelectric conversion element 101 is formed. As the insulating layer 580, a silicon oxide film with a high light-transmitting property with respect to visible light can be used. In addition, a silicon nitride film may be stacked as a passivation film. A dielectric film of hafnium oxide or the like may be stacked as an anti-reflection film.

A light-blocking layer 581 may be formed over the insulating layer 580. The light-blocking layer 581 has a function of inhibiting color mixing of light passing through the upper color filter. As the light-blocking layer 581, a metal layer of aluminum, tungsten, or the like can be used. The metal layer and a dielectric film having a function of an anti-reflection film may be stacked.

An organic resin layer 582 can be provided as a planarization film over the insulating layer 580 and the light-blocking layer 581. A color filter 583 (color filters 583*a*, 583*b*, and 583*c*) is formed in each pixel. Color images can be obtained, for example, when colors of R (red), G (green), B (blue), Y (yellow), C (cyan), M (magenta), and the like are assigned to the color filters 583*a*, 583*b*, and 583*c*.

An insulating layer 586 having a light-transmitting property with respect to visible light can be provided over the color filter 583, for example.

Figure 17B:
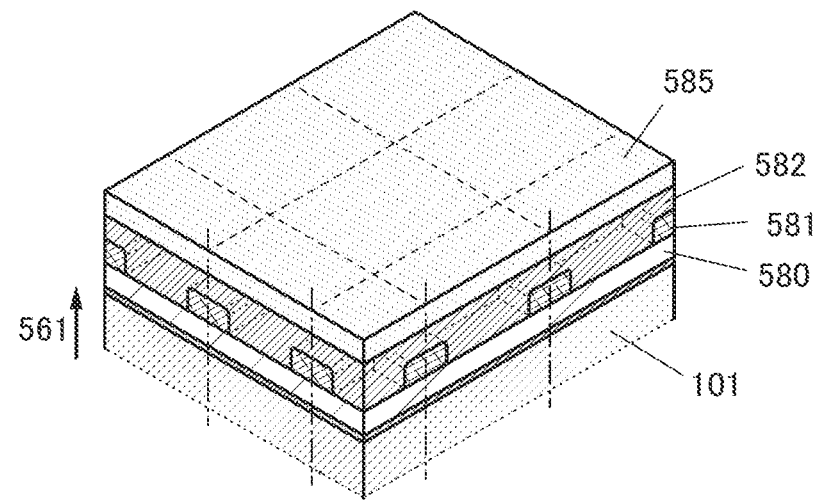

As shown in FIG. 17(B), an optical conversion layer 585 may be used instead of the color filter 583. Such a structure enables the imaging device to obtain images in various wavelength regions.

For example, when a filter that blocks light having a wavelength shorter than or equal to that of visible light is used as the optical conversion layer 585, an infrared imaging device can be obtained. When a filter that blocks light having a wavelength shorter than or equal to that of near infrared light is used as the optical conversion layer 585, a far-infrared imaging device can be obtained. When a filter that blocks light having a wavelength longer than or equal to that of visible light is used as the optical conversion layer 585, an ultraviolet imaging device can be obtained. Alternatively, a color filter corresponding to visible light and a filter corresponding to infrared rays or ultraviolet rays may be combined. In one embodiment of the present invention, an arithmetic operation is performed using adjacent pixels, and thus a characteristic obtained by combining different wavelengths can be detected.

Furthermore, when a scintillator is used as the optical conversion layer 585, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion element 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, $ZnO$, or the like is dispersed can be used.

In the photoelectric conversion element 101 containing a selenium-based material, radiation such as X-rays can be directly converted into charge; thus, a structure that does not require a scintillator can be employed.

Figure 17C:
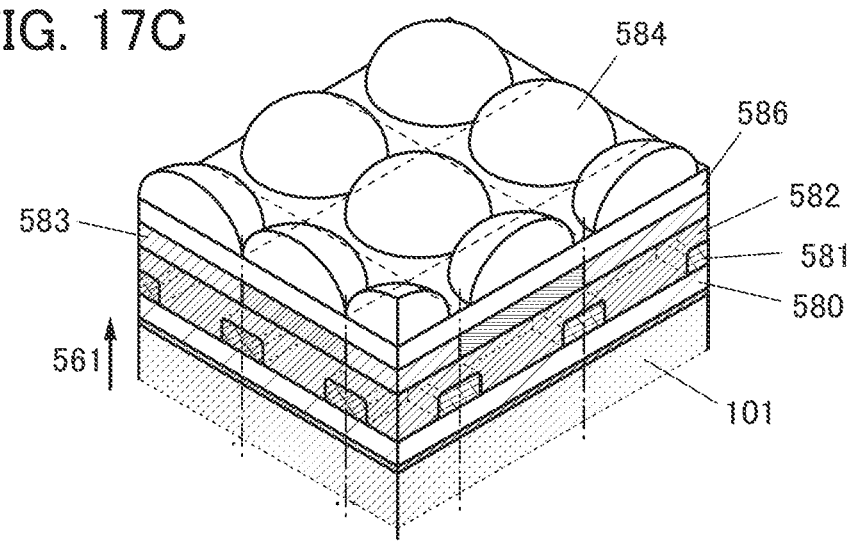

As shown in FIG. 17(C), a microlens array 584 may be provided over the color filter 583. Light penetrating lenses included in the microlens array 584 goes through the color filter 583 positioned thereunder to irradiate the photoelectric conversion element 101. The microlens array 584 may be provided over the optical conversion layer 585 shown in FIG. 17(B).

Examples of a package and a camera module in each of which an image sensor chip is placed will be described below. For the image sensor chip, the structure of the above imaging device can be used.

FIG. 18(A1) is an external perspective view of the top surface side of a package in which an image sensor chip is placed. The package includes a package substrate 610 to which an image sensor chip 650 is fixed, a cover glass 620, an adhesive 630 for bonding them, and the like.

FIG. 18(A2) is an external perspective view of the bottom surface side of the package. A BGA (Ball grid array) in which solder balls are used as bumps 640 on the bottom surface of the package is employed. Note that, without being limited to the BGA, an LGA (Land grid array), a PGA (Pin Grid Array), or the like may be employed.

FIG. 18(A3) is a perspective view of the package, in which parts of the cover glass 620 and the adhesive 630 are not illustrated. Electrode pads 660 are formed over the package substrate 610, and the electrode pads 660 and the bumps 640 are electrically connected to each other via through-holes. The electrode pads 660 are electrically connected to the image sensor chip 650 through wires 670.

FIG. 18(B1) is an external perspective view of the top surface side of a camera module in which an image sensor chip is placed in a package with a built-in lens. The camera module includes a package substrate 611 to which an image sensor chip 651 is fixed, a lens cover 621, a lens 635, and the like. Furthermore, an IC chip 690 having a function of a driver circuit, a signal conversion circuit, or the like of an imaging device is provided between the package substrate 611 and the image sensor chip 651; thus, the structure as an SiP (System in package) is formed.

FIG. 18(B2) is an external perspective view of the bottom surface side of the camera module. A QFN (Quad flat no-lead package) structure in which lands 641 for mounting are provided on the bottom surface and side surfaces of the package substrate 611 is employed. Note that this structure is only an example, and a QFP (Quad flat package) or the above-mentioned BGA may also be provided.

FIG. 18(B3) is a perspective view of the module, in which parts of the lens cover 621 and the lens 635 are not illustrated. The lands 641 are electrically connected to electrode pads 661, and the electrode pads 661 are electrically connected to the image sensor chip 651 or the IC chip 690 through wires 671.

The image sensor chip placed in a package having the above form can be easily mounted on a printed substrate or the like, and the image sensor chip can be incorporated into a variety of semiconductor devices and electronic devices.

This embodiment can be combined with any of the other embodiments as appropriate.

Embodiment 4

As electronic devices that can include an imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. Specific examples of these electronic devices are illustrated in FIGS. 19(A) to 19(F).

Figure 19A:
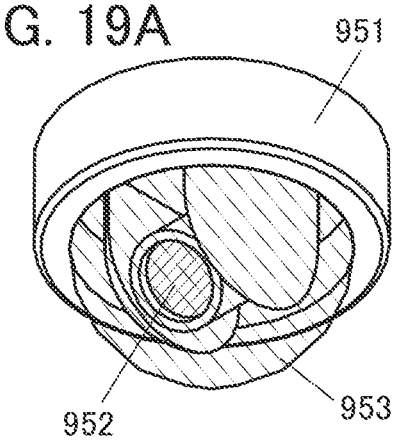
FIGS. 19A-19F Diagrams illustrating electronic devices.

FIG. 19(A) illustrates a surveillance camera, which includes a support base 951, a camera unit 952, a protection cover 953, and the like. By providing the camera unit 952 provided with a rotating mechanism and the like on a ceiling, an image of the entire circumstance can be taken. The imaging device of one embodiment of the present invention can be provided, as a component for obtaining an image, in the camera unit. Note that a surveillance camera is a name in common use and does not limit the use thereof. A device that has a function of a surveillance camera can also be called a camera or a video camera, for example.

Figure 19B:
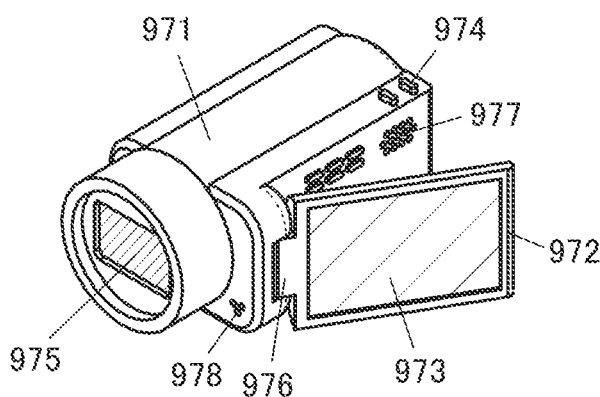

FIG. 19(B) is a video camera, which includes a first housing 971, a second housing 972, a display portion 973, an operation key 974, a lens 975, a connection portion 976, a speaker 977, a microphone 978, and the like. The operation key 974 and the lens 975 are provided on the first housing 971, and the display portion 973 is provided on the second housing 972. The imaging device of one embodiment of the present invention can be included, as a component for obtaining an image, in the video camera.

Figure 19C:
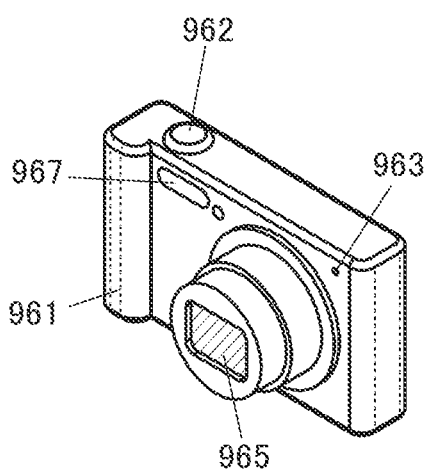

FIG. 19(C) is a digital camera, which includes a housing 961, a shutter button 962, a microphone 963, a light-emitting portion 967, a lens 965, and the like. The imaging device of one embodiment of the present invention can be included, as a component for obtaining an image, in the digital camera.

Figure 19D:
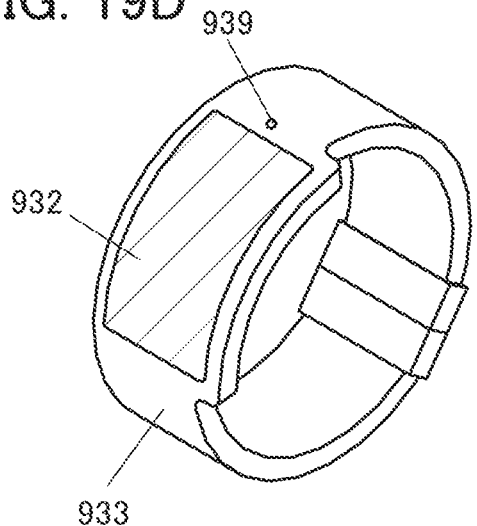

FIG. 19(D) shows a wrist-watch-information terminal, which includes a display portion 932, a housing and wristband 933, a camera 939, and the like. The display portion 932 is provided with a touch panel for operation of the information terminal. The display portion 932 and the housing and wristband 933 have flexibility and fit a body well. The imaging device of one embodiment of the present invention can be included, as a component for obtaining an image, in the information terminal.

Figure 19E:
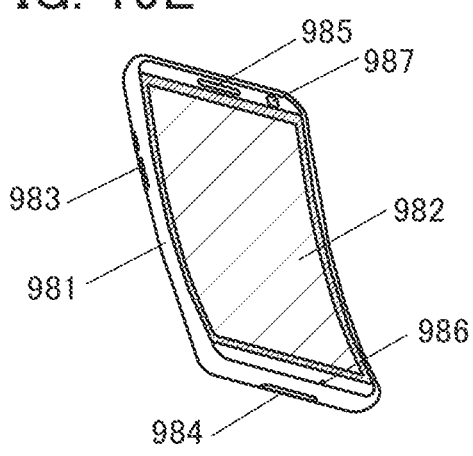

FIG. 19(E) is an example of a mobile phone, which includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention can be included, as a component for obtaining an image, in the mobile phone.

Figure 19F:
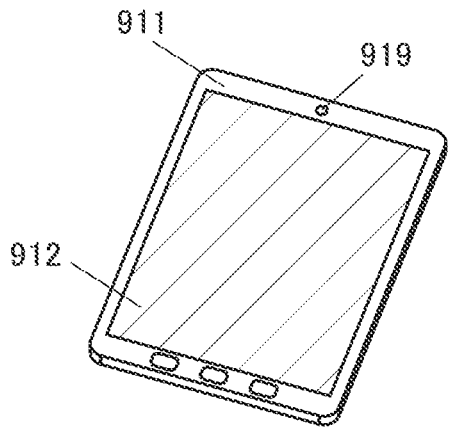

FIG. 19(F) is a portable data terminal, which includes a housing 911, a display portion 912, a camera 919, and the like. A touch panel function of the display portion 912 enables input and output of information. The imaging device of one embodiment of the present invention can be included, as a component for obtaining an image, in the portable data terminal.

This embodiment can be combined with any of the other embodiments as appropriate.

REFERENCE NUMERALS

100a: pixel, 100b: pixel, 101: photoelectric conversion element, 102: transistor, 103: inverter circuit, 104: transistor, 105: inverter circuit, 106: transistor, 107: capacitor, 108: capacitor, 109: transistor, 110a: pulse generation unit, 110b: pulse generation unit, 111: wiring, 112: wiring, 113: wiring, 114: wiring, 200: pixel array, 201: circuit, 202: circuit, 203: circuit, 300: pixel block, 301: transistor, 302: transistor, 303: transistor, 304: capacitor, 311: wiring, 312: wiring, 313: wiring, 314: wiring, 400: pixel block, 401: circuit, 402: circuit, 403: circuit, 404: circuit, 405: circuit, 411: transistor, 412: transistor, 450: pixel array, 500: circuit, 501: wiring, 502: wiring, 503: wiring, 531: conductive layer, 532: conductive layer, 533: conductive layer, 534: conductive layer, 535: back gate, 536: region, 537: conductive layer, 540: silicon substrate, 541: insulating layer, 542: insulating layer, 543: insulating layer, 545: semiconductor layer, 546: insulating layer, 561: layer, 562: layer, 563: layer, 565a: layer, 565b: layer, 565c: layer, 566a: layer, 566b: layer, 566c: layer, 566d: layer, 580: insulating layer, 581: light-blocking layer, 582: organic resin layer, 583: color filter, 583a: color filter, 583b: color filter, 583c: color filter, 584: microlens array, 585: optical conversion layer, 586: insulating layer, 610: package substrate, 611: package substrate, 620: cover glass, 621: lens cover, 630: adhesive, 635: lens, 640: bump, 641: land, 650: image sensor chip, 651: image sensor chip, 660: electrode pad, 661: electrode pad, 670: wire, 671: wire, 690: IC chip, 911: housing, 912: display portion, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera

The invention claimed is:

1. An imaging device comprising:
   a photoelectric conversion element, a first transistor, a second transistor, a first inverter circuit, and a second inverter circuit,
   wherein the photoelectric conversion element is electrically connected to an input terminal of the first inverter circuit, one of a source and a drain of the first transistor, and one of a source and a drain of the second transistor,
   wherein an output terminal of the first inverter circuit is electrically connected to a gate of the first transistor and an input terminal of the second inverter circuit,
   wherein an output terminal of the second inverter circuit is electrically connected to a gate of the second transistor, and
   wherein a polarity of the first transistor is different from a polarity of the second transistor.

2. The imaging device according to claim 1, further comprising a third transistor,
   wherein one of a source and a drain of the third transistor is electrically connected to the photoelectric conversion element, and
   wherein the other of the source and drain of the third transistor is electrically connected to the input terminal of the first inverter circuit.

3. The imaging device according to claim 2,
   wherein the third transistor includes a metal oxide in a channel formation region, and
   wherein the metal oxide includes indium.

4. The imaging device according to claim 1, further comprising a first capacitor and a second capacitor,
   wherein the first capacitor is electrically connected to the input terminal of the first inverter circuit, and
   wherein the second capacitor is electrically connected to the output terminal of the second inverter circuit.

5. The imaging device according to claim 1, further comprising a fourth transistor,
   wherein one of a source and a drain of the fourth transistor is electrically connected to the output terminal of the second inverter circuit.

6. The imaging device according to claim 5,
wherein the other of the source and the drain of the fourth transistor is electrically connected to a counter circuit.

7. The imaging device according to claim 1,
wherein the photoelectric conversion element includes selenium.

8. An electronic device comprising the imaging device according to claim 1.

9. The imaging device according to claim 1,
wherein the first transistor is a p-channel transistor, and
wherein the second transistor is an n-channel transistor.

10. The imaging device according to claim 1,
wherein the other of the source and the drain of the first transistor is electrically connected to a first power supply line, and
wherein the other of the source and the drain of the second transistor is electrically connected to a second power supply line.

11. An imaging device comprising:
a first transistor, a second transistor, a first inverter circuit, and a second inverter circuit,
wherein an input terminal of the first inverter circuit is electrically connected to one of a source and a drain of the first transistor and one of a source and a drain of the second transistor,
wherein an output terminal of the first inverter circuit is electrically connected to a gate of the first transistor and an input terminal of the second inverter circuit,
wherein an output terminal of the second inverter circuit is electrically connected to a gate of the second transistor,
wherein a polarity of the first transistor is different from a polarity of the second transistor.

12. The imaging device according to claim 11, further comprising a first capacitor and a second capacitor,
wherein the first capacitor is electrically connected to the input terminal of the first inverter circuit, and
wherein the second capacitor is electrically connected to the output terminal of the second inverter circuit.

13. An electronic device comprising the imaging device according to claim 11.

14. The imaging device according to claim 11,
wherein the first transistor is a p-channel transistor, and
wherein the second transistor is an n-channel transistor.

15. The imaging device according to claim 11,
wherein the other of the source and the drain of the first transistor is electrically connected to a first power supply line, and
wherein the other of the source and the drain of the second transistor is electrically connected to a second power supply line.

16. The imaging device according to claim 11, wherein the output terminal of the second inverter circuit is electrically connected to a read circuit.

17. The imaging device according to claim 11, wherein the output terminal of the second inverter circuit is electrically connected to an output line.

18. The imaging device according to claim 11, wherein the output terminal of the second inverter circuit is electrically connected to a circuit including a neural network.

* * * * *